United States Patent
Lee et al.

(10) Patent No.: US 12,526,994 B2
(45) Date of Patent: Jan. 13, 2026

(54) THREE DIMENSIONAL SEMICONDUCTOR DEVICE AND A METHOD FOR MANUFACTURING THE SAME

(71) Applicant: Samsung Electronics Co., Ltd., Suwon-si (KR)

(72) Inventors: Kyen-Hee Lee, Suwon-si (KR); Kyungsoo Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 633 days.

(21) Appl. No.: 17/961,035

(22) Filed: Oct. 6, 2022

(65) Prior Publication Data

US 2023/0292508 A1   Sep. 14, 2023

(30) Foreign Application Priority Data

Mar. 11, 2022   (KR) .......................... 10-2022-0030429

(51) Int. Cl.
*H01L 27/11582*   (2017.01)
*H01L 27/11519*   (2017.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02); *H10D 30/6729* (2025.01); *H10D 30/6735* (2025.01)

(58) Field of Classification Search
CPC ........ H10B 43/27; H10B 41/10; H10B 41/27; H10B 41/35; H10B 43/10; H10B 43/35; H10B 43/20; H10D 30/6729; H10D 30/6735; H10D 30/6757; H10D 30/014; H10D 30/43; H10D 64/251; H10D 62/121; H10D 84/0186; H10D 84/038; (Continued)

(56) References Cited

U.S. PATENT DOCUMENTS 7,368,788 B2   5/2008   Huo et al.
10,332,588 B2   6/2019   Huynh Bao et al.
(Continued)

FOREIGN PATENT DOCUMENTS

KR   10-2023-0023332 A   8/2021
KR   10-2022-0000397 A   1/2022

*Primary Examiner* — Tong-Ho Kim
(74) *Attorney, Agent, or Firm* — Fish & Richardson P.C.

(57) ABSTRACT

A three dimensional semiconductor device includes first, second, third and fourth source/drain patterns sequentially stacked on a substrate, a contact structure on the first to fourth source/drain patterns and a contact line on the contact structure. The contact structure includes a first active contact on the first source/drain pattern, a second active contact on the second source/drain pattern, a third active contact on the third source/drain pattern, and a fourth active contact on the fourth source/drain pattern. A first vertical extension part of the first active contact is adjacent to one side of the contact structure, and a second vertical extension part of the second active contact is adjacent to the other side of the contact structure. A third vertical extension part of the third active contact is disposed between the first and second vertical extension parts and is closer to the first vertical extension part.

19 Claims, 30 Drawing Sheets

(51) Int. Cl.
*H01L 27/11524* (2017.01)
*H01L 27/11556* (2017.01)
*H01L 27/11565* (2017.01)
*H01L 27/1157* (2017.01)
*H01L 29/417* (2006.01)
*H01L 29/423* (2006.01)
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)
*H10D 30/67* (2025.01)

(58) Field of Classification Search
CPC ........ H10D 88/01; H10D 84/85; H10D 88/00; H10D 84/856; H10D 84/80; B82Y 10/00

USPC ....................................................... 257/314
See application file for complete search history.

(56) References Cited

U.S. PATENT DOCUMENTS

| | | |
|---|---|---|
| 10,381,438 B2 | 8/2019 | Zhang et al. |
| 10,964,706 B2 | 3/2021 | Smith et al. |
| 11,152,360 B2 | 10/2021 | Barraud et al. |
| 2019/0131396 A1* | 5/2019 | Zhang ................... B82Y 10/00 |
| 2020/0075574 A1 | 3/2020 | Smith et al. |
| 2020/0083340 A1 | 3/2020 | Wu et al. |
| 2020/0335501 A1 | 10/2020 | Dewey et al. |
| 2020/0373203 A1* | 11/2020 | Liebmann ......... H01L 21/76801 |
| 2021/0202500 A1 | 7/2021 | Chanemougame et al. |
| 2021/0280582 A1* | 9/2021 | Lu ....................... H10D 84/038 |

* cited by examiner

<br>

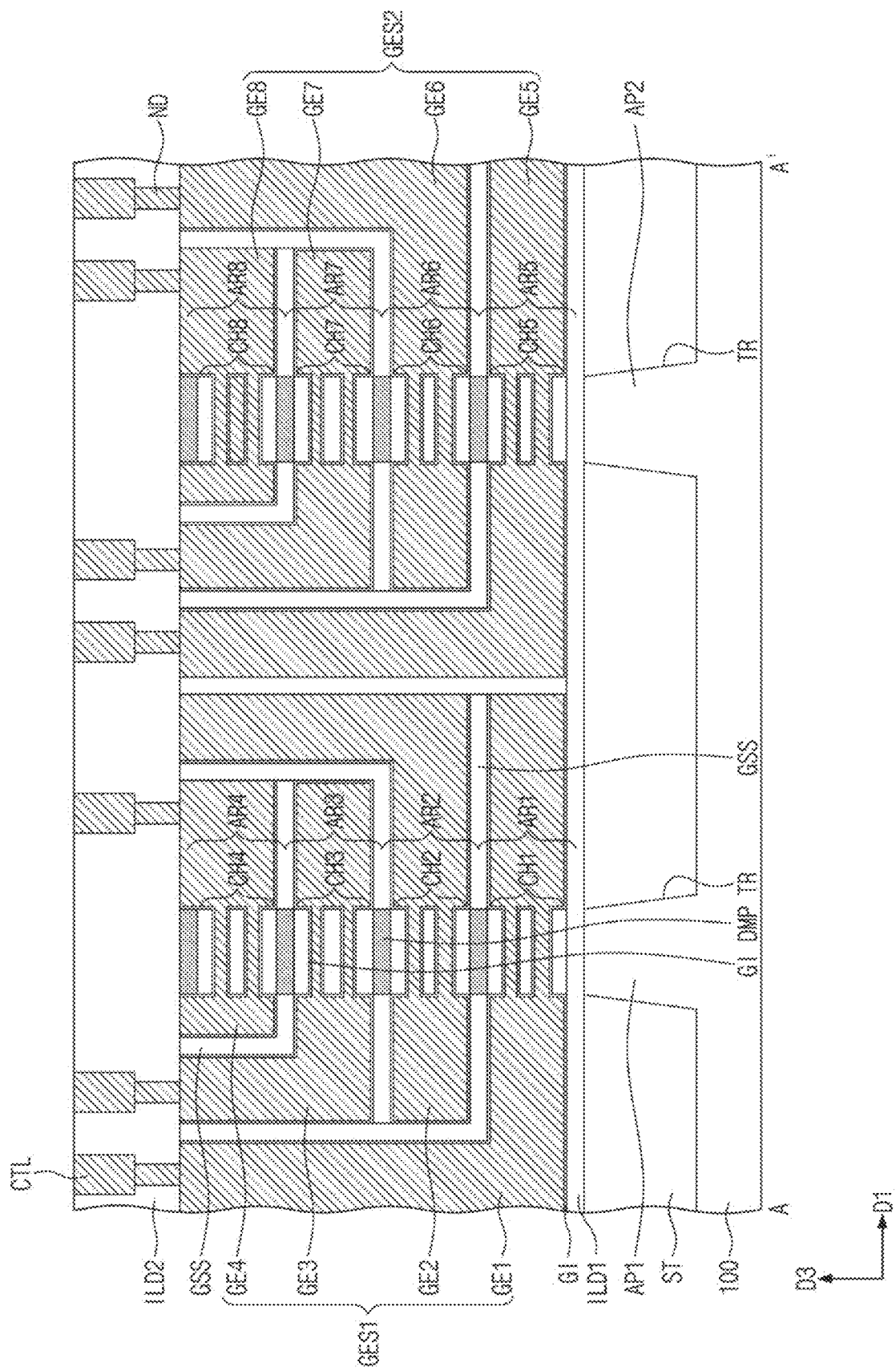

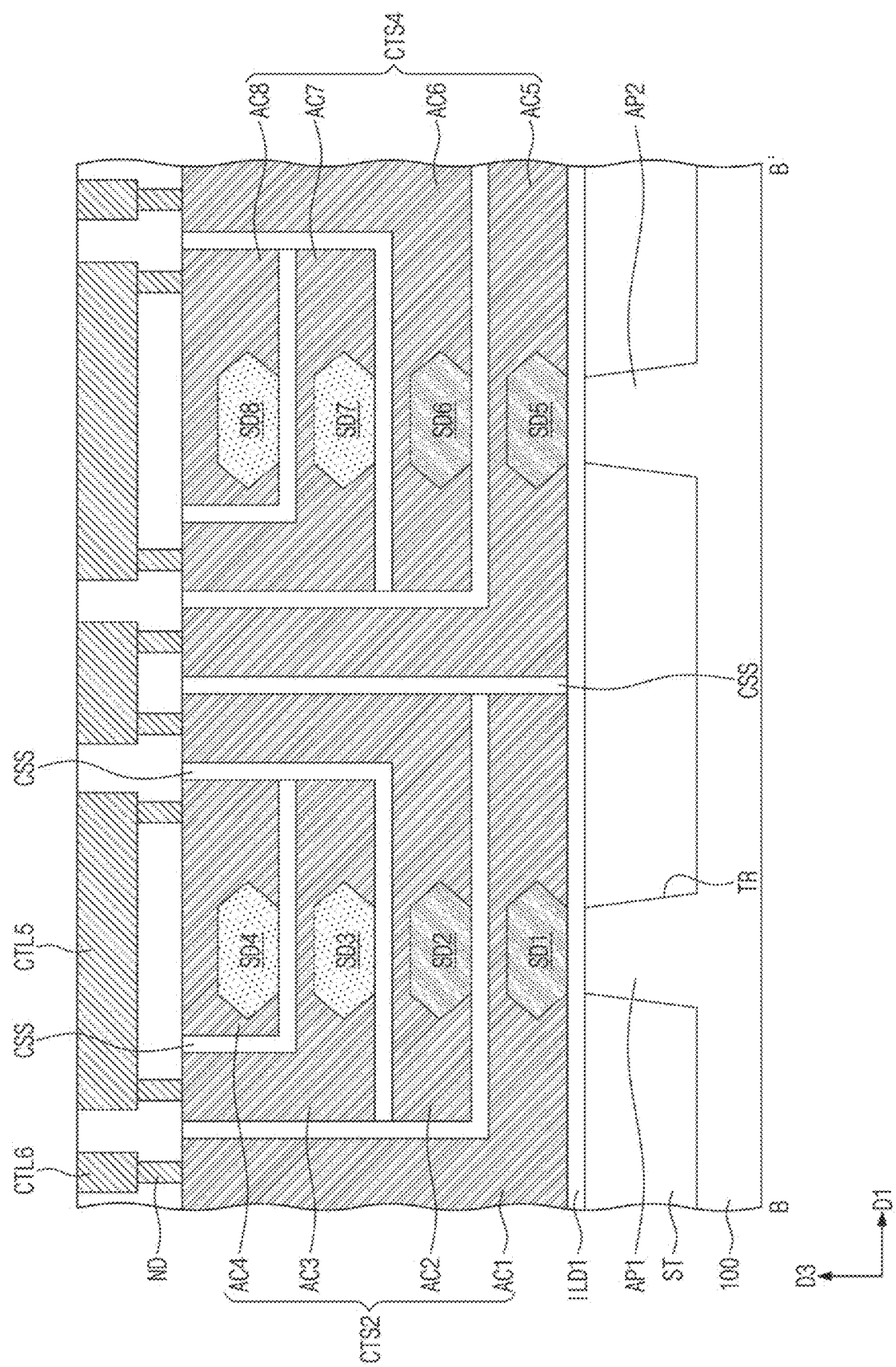

THREE DIMENSIONAL SEMICONDUCTOR DEVICE AND A METHOD FOR MANUFACTURING THE SAME

CROSS-REFERENCE TO RELATED APPLICATIONS

This U.S. non-provisional patent application claims priority under 35 U.S.C. § 119 to Korean Patent Application No. 10-2022-0030429, filed on Mar. 11, 2022, in the Korean Intellectual Property Office, the entire contents of which are hereby incorporated by reference.

BACKGROUND

Inventive concepts relate to a three dimensional semiconductor device and/or a method for manufacturing the same, and more particularly, to a three dimensional semiconductor device including a field effect transistor and/or a method for manufacturing the same.

A semiconductor device includes an integrated circuit constituting Metal Oxide Semiconductor Field Effect Transistors (MOS FET). As a size of semiconductor devices and design rules are gradually reduced, scale down of MOS field effect transistors is also accelerating. As the size of the MOS field effect transistors is reduced, operating characteristics of the semiconductor device may deteriorate. Accordingly, various methods for forming semiconductor devices with superior performance while overcoming or at least partially overcoming limitations due to high integration of semiconductor devices are being studied.

SUMMARY

Some example embodiments of the inventive concept provide a three dimensional semiconductor device with improved integration and electrical characteristics.

Alternatively or additionally, some example embodiments of inventive concepts provides a method of manufacturing a three dimensional semiconductor device having improved integration and electrical characteristics.

According to some example embodiments of inventive concepts, a three dimensional semiconductor device may include first, second, third, and fourth source/drain patterns sequentially stacked on a substrate, a contact structure on the first to fourth source/drain patterns, and a contact line on the contact structure. The contact structure may include a first active contact on the first source/drain pattern, a second active contact on the second source/drain pattern, a third active contact on the third source/drain pattern, and a fourth active contact on the fourth source/drain pattern. The first active contact may include a first horizontal extension part connected to the first source/drain pattern and a first vertical extension part extending from the first horizontal extension part to an uppermost portion of the contact structure, the second active contact may include a second horizontal extension part connected to the second source/drain pattern and a second vertical extension part extending from the second horizontal extension part to the uppermost portion of the contact structure, the third active contact may include a third horizontal extension connected to the third source/drain pattern and a third vertical extension part extending from the third horizontal extension to the uppermost portion of the contact structure, the fourth active contact may include a fourth horizontal extension part connected to the fourth source/drain pattern, the first vertical extension part may be adjacent to one side of the contact structure, and the second vertical extension part may be adjacent to the other side of the contact structure, and the third vertical extension part may be arranged between the first and second vertical extension parts and is closer to the first vertical extension part.

According to some example embodiments of inventive concepts, a three dimensional semiconductor device may include first, second, third, and fourth source/drain patterns sequentially stacked on a substrate, a contact structure on the first to fourth source/drain patterns, and a contact line on the contact structure, the contact structure may include a first active contact connected to the first source/drain pattern, a second active contact connected to the second source/drain pattern, a third active contact connected to the third source/drain pattern, and a fourth active contact connected to the fourth source/drain pattern, the first to fourth active contacts may be sequentially stacked along the first to fourth source/drain patterns, respectively, the first to third active contacts may include first to third vertical extension parts extending to an uppermost portion of the contact structure, respectively, the second vertical extension part may face the first vertical extension part with the stacked first to fourth source/drain patterns interposed therebetween, and the third vertical extension part may face the second vertical extension part with the stacked first to fourth source/drain patterns interposed therebetween.

According to some example embodiments of inventive concepts, a three dimensional semiconductor device may include first, second, third, and fourth source/drain patterns sequentially stacked on a substrate, a contact structure on the first to fourth source/drain patterns, and a first contact line and a second contact line on the contact structure, the contact structure may include a first active contact connected to the first source/drain pattern, a second active contact connected to the second source/drain pattern, a third active contact connected to the third source/drain pattern, and fourth active contact connected to the fourth source/drain pattern, the first to fourth active contacts may be sequentially stacked along the first to fourth source/drain patterns, respectively, the first to third active contacts may each include first to third vertical extension parts extending to an uppermost portion of the contact structure, the first vertical extension part and the third vertical extension part adjacent to each other may be electrically connected to each other by the first contact line, and the second vertical extension prat and the fourth active contact adjacent to each other may be electrically connected to each other by the second contact line.

BRIEF DESCRIPTION OF THE DRAWINGS

Various example embodiments will be more clearly understood from the following brief description taken in conjunction with the accompanying drawings. The accompanying drawings represent non-limiting, example embodiments as described herein.

FIGS. 18A and 18B are cross-sectional views taken along lines A-A' and B-B' of FIG. 17, respectively.

It should be noted that these figures are intended to illustrate the general characteristics of methods, structure and/or materials utilized in certain example embodiments and to supplement the written description provided below. These drawings are not necessarily, however, to scale and may not precisely reflect the precise structural and/or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, various example embodiments of inventive concepts will now be described with reference to the accompanying drawings.

Figure 1:
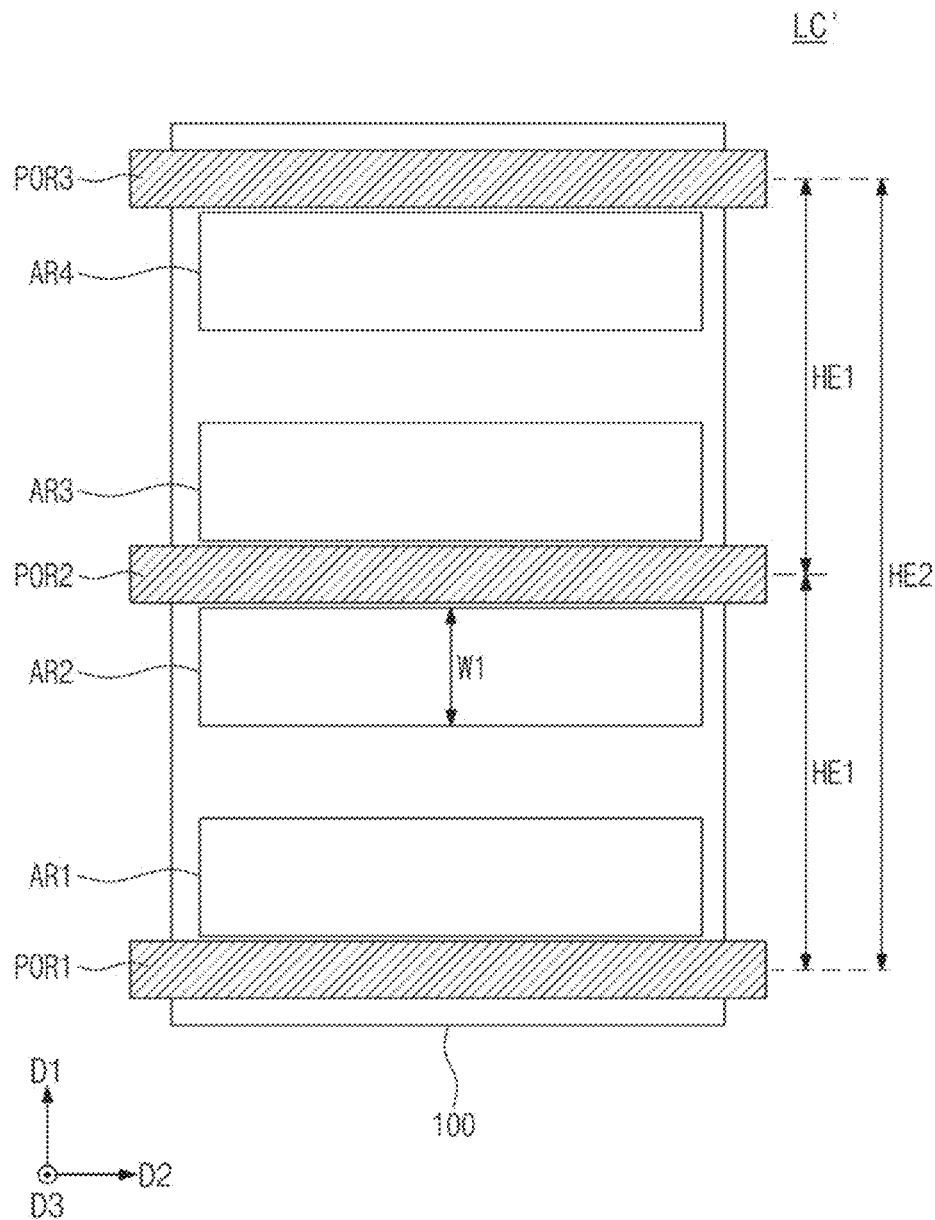
FIG. 1 is a conceptual diagram for explaining a logic cell of a semiconductor device according to a comparative example of inventive concepts.

FIG. 1 is a conceptual diagram for explaining a logic cell of a semiconductor device according to a comparative example of inventive concepts. FIG. 1 illustrates a logic cell of a two dimensional device according to a comparative example of inventive concepts.

Referring to FIG. 1, a logic cell LC' according to a comparative example may be provided. Specifically, a first power line POR1, a second power line POR2, and a third power line POR3 may be provided on the substrate 100. One of a drain voltage VDD and a source voltage VSS may be applied to the first and third power lines POR1 and POR3. The other one of the drain voltage VDD and the source voltage VSS may be applied to the second power line POR2.

A first active region AR1 and a second active region AR2 may be provided between the first power line POR1 and the second power line POR2. A third active region AR3 and a fourth active region AR4 may be provided between the second power line POR2 and the third power line POR3. The first and fourth active regions AR1 and AR4 may be one of a PMOSFET region and an NMOSFET region. The second and third active regions AR2 and AR3 may be the other one of the PMOSFET region and the NMOSFET region.

For example, in the logic cell LC' of a two dimensional device, a first CMOS may be provided between the first power line POR1 and the second power line POR2, and the second power line POR2 and a second CMOS may be provided between the third power line POR3.

As the semiconductor device according to the comparative example is a two dimensional device, transistors of a Front End of Line (FEOL) layer may be two-dimensionally or planarly arranged. For example, transistors in the first active region AR1 and transistors in the second active region AR2 may be formed or arranged to be spaced apart from one another in a first direction D1.

Each of the first to fourth active regions AR1 to AR4 may have a first width W1 in the first direction D1. A pitch or a center-to-center distance between the first power line POR1 and the second power line POR2 may be defined as a first height HE1. A pitch or a center-to-center distance between the second power line POR2 and the third power line POR3 may be equal to the first height HE1.

A distance between the first power line POR1 and the third power line POR3 may be defined as a length of the logic cell LC' of the comparative example in the first direction D1. The length of the logic cell LC' in the first direction D1 may be a second height HE2. The second height HE2 may be twice the first height HE1.

The logic cell LC' may be a logic device that performs a specific function, and may include, for example, NAND gates and/or NOR gates and/or inverters and/or other specific functions such as but not limited to AND-OR-INVERT (AOI) gates. The logic cell LC' may include transistors constituting a logic device and wirings connecting the transistors to one another, for example to and from gates and/or sources and/or drains of one transistor to gates and/or sources and/or drains of one or more other transistors.

As the logic cell LC' according to the present comparative example includes the two dimensional device, the first to fourth active regions AR1 to AR4 may not overlap one another and may be spaced apart, e.g. horizontally spaced apart from one another. Accordingly, the second height HE2 of the logic cell LC' may or should be defined to cover all of the first to fourth active regions AR1 to AR4 spaced apart from one another. As a result, the second height HE2 of the logic cell LC' according to comparative examples may be relatively large. For example, the area of the logic cell LC' according to the present comparative example may be relatively large.

Figure 2:
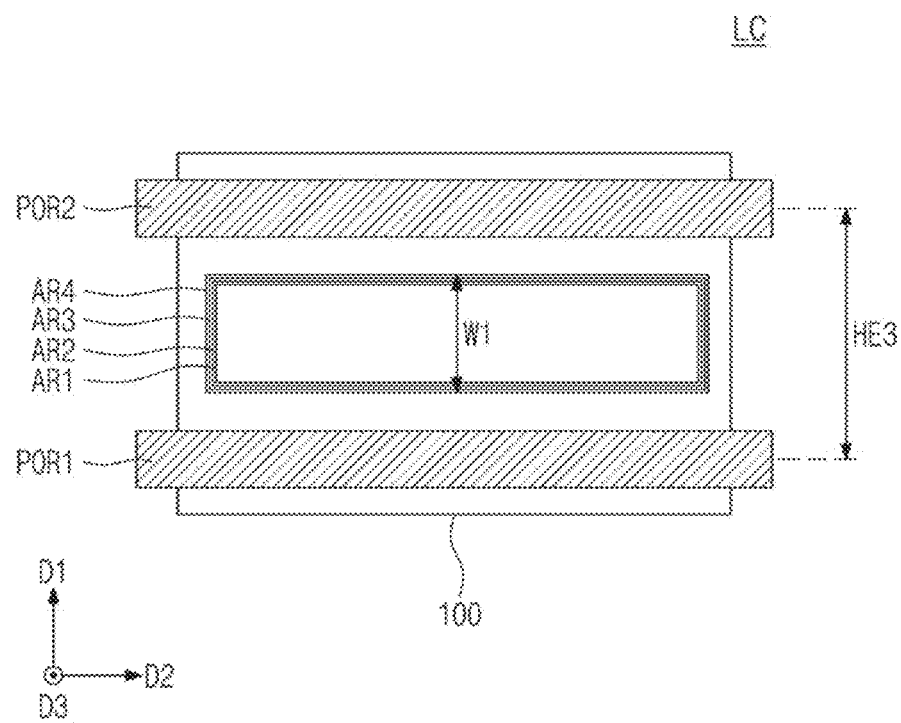
FIG. 2 is a conceptual diagram for explaining a logic cell of a semiconductor device according to some example embodiments of inventive concepts.

FIG. 2 is a conceptual diagram for explaining a logic cell of a semiconductor device according to some example embodiments of inventive concepts. FIG. 2 illustrates a logic cell of a three dimensional device according to some example embodiments of inventive concepts.

Referring to FIG. 2, a logic cell LC including a three dimensional device (e.g., a stacked transistor) may be provided. In more detail, a first power line POR1 and a second power line POR2 may be provided on a substrate 100. A logic cell LC according to various example embodiments may be defined between the first power line POR1 and the second power line POR2.

The logic cell LC of various example embodiments may include first to fourth active regions AR1 to AR4. At least one of the first to fourth active regions AR1 to AR4 may be a PMOSFET region which includes PMOS transistors and may not include NMOS transistors, and the others may be an NMOSFET region which includes NMOS transistors and may not include PMOS transistors.

As the semiconductor device according to various example embodiments may be or may include a three dimensional device, transistors of the FEOL layer may be vertically stacked. The first to fourth active regions AR1 to AR4 may be sequentially stacked on the substrate 100. The first to fourth active regions AR1 to AR4 may be spaced apart from one another in a vertical direction, that is, in a third direction D3.

Each of the first to fourth active regions AR1 to AR4 may have a first width W1 in a first direction D1. A length of the logic cell LC in the first direction D1 according to various example embodiments may be defined as a third height HE3.

The logic cell LC according to various example embodiments may include a three dimensional device, that is, a stacked transistor, and thus the first to fourth active regions AR1 to AR4 may overlap each other. Accordingly, the third height HE3 of the logic cell LC may have a size sufficient to cover the above-described first width W1. As a result, the third height HE3 of the logic cell LC according to various example embodiments may be significantly smaller than the second height HE2 of the logic cell LC' of FIG. 1 described above. For example, the area of the logic cell LC according to various example embodiments may be significantly smaller than the area of the logic cell LC' of FIG. 1. In the three dimensional semiconductor device according to various example embodiments, integration of the device may be improved by reducing the area of the logic cell. Additionally or alternatively, a cost of fabrication of the three dimensional semiconductor device may be significantly reduced.

Figure 3:
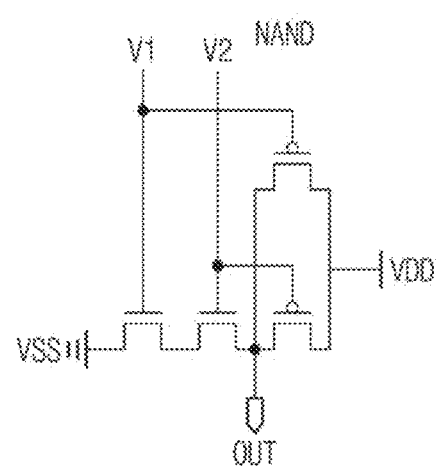
FIG. 3 is a circuit diagram of a NAND according to some example embodiments of inventive concepts.
Figure 4:
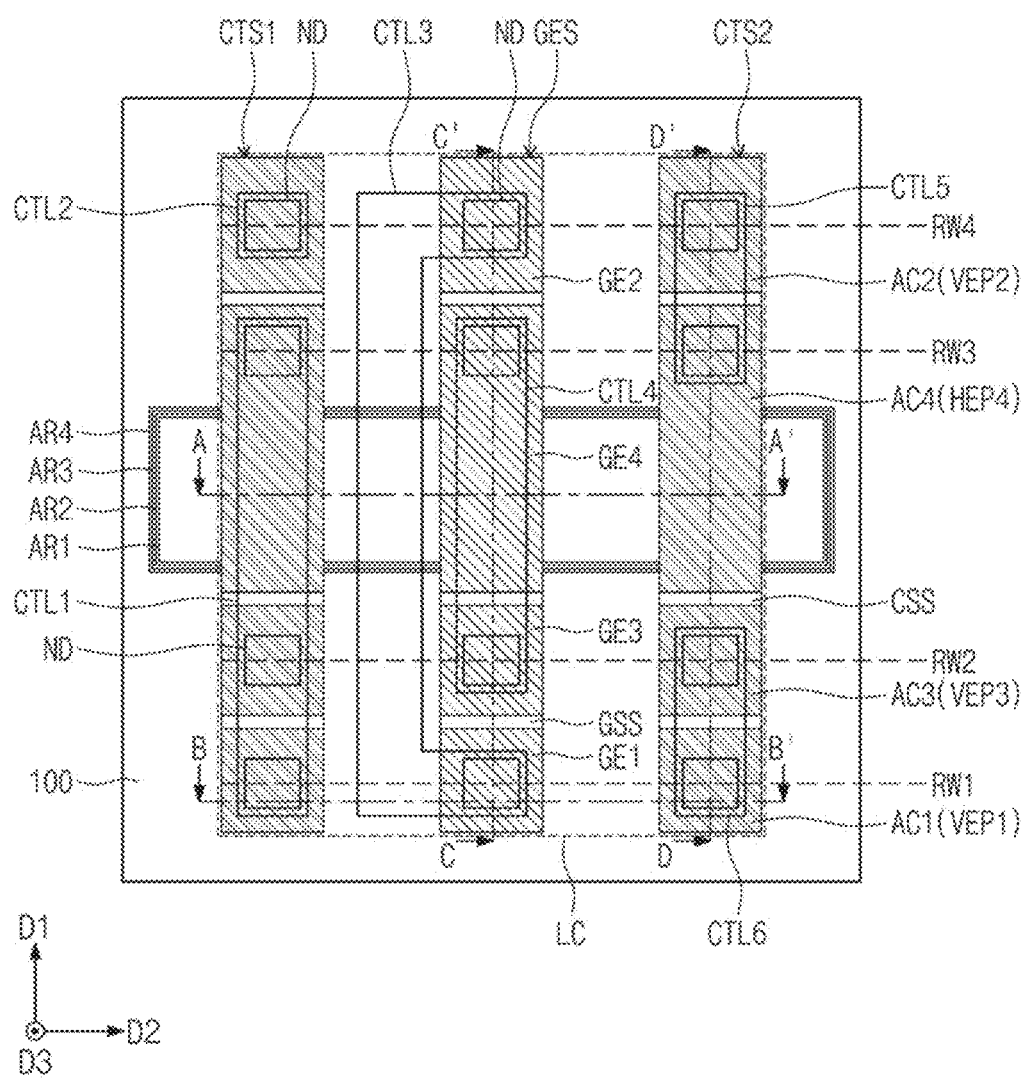
FIG. 4 is a plan view for explaining a three dimensional semiconductor device according to some example embodiments of inventive concepts.

FIG. 3 is a circuit diagram of a NAND according to some example embodiments of inventive concepts. FIG. 4 is a plan view for explaining a three dimensional semiconductor device according to some example embodiments of inventive concepts. FIGS. 5A to 5D are cross-sectional views taken along line A-A', line B-B', line C-C', and line D-D' of FIG. 4, respectively. The three dimensional semiconductor device illustrated in FIGS. 4 and 5A to 5D is an example of the logic cell LC of FIG. 2 in detail. The three dimensional semiconductor device shown in FIGS. 4 and 5A to 5D is an example in which the NAND logic device of FIG. 3 is implemented as a three dimensional semiconductor device according to inventive concepts.

Referring to FIGS. 4 and 5A to 5D, a logic cell LC may be provided on a substrate 100. The logic cell LC according to various example embodiments may be a NAND cell. The substrate 100 may be or may include a semiconductor substrate including silicon, germanium, silicon germanium, or the like, or a compound semiconductor substrate, and may or may not be doped, e.g. may or may not be lightly doped with impurities such as boron. For example, the substrate 100 may be a silicon substrate.

The logic cell LC may include first to fourth active regions AR1 to AR4 sequentially stacked on the substrate 100. Although four active regions are illustrated, example embodiments are not limited thereto. The first active region AR1 may be disposed in a first tier. The second active region AR2 may be disposed in a second tier on the first tier. The third active region AR3 may be disposed in a third tier on the second tier. The fourth active region AR4 may be disposed in a fourth tier on the third tier. The first tier may be closest to the substrate 100. The fourth tier may be vertically furthest from the substrate 100.

In some example embodiments, the first and third active regions AR1 and AR3 may be PMOSFET regions, and the second and fourth active regions AR2 and AR4 may be NMOSFET regions. Alternatively, in some example embodiments, the first and third active regions AR1 and AR3 may be NMOSFET regions, and the second and fourth active regions AR2 and AR4 may be PMOSFET regions. The PMOSFET regions and the NMOSFET regions of the first to fourth active regions AR1 to AR4 may be alternately stacked to form a three dimensional stacked transistor.

An active pattern AP may be defined by a trench TR formed on the substrate 100. The active pattern AP may be a part of the substrate 100 and may be a vertically protruding part. In a plan view, the active pattern AP may have a bar shape extending in a second direction D2. The above-described first to fourth active regions AR1 to AR4 may be sequentially stacked on the active pattern AP.

A device isolation layer ST may fill the trench TR. The device isolation layer ST may include a silicon oxide layer. A top surface of the device isolation layer ST may be coplanar with a top surface of the active pattern AP or may be lower than the top surface of the active pattern AP. The device isolation layer ST may not cover channel patterns CH1 to CH4. In some example embodiments of inventive concepts, a first insulating layer ILD1 may be provided on the active pattern AP and the device isolation layer ST. The first insulating layer ILD1 may be omitted.

The first active region AR1 including a first channel pattern CH1 and a pair of first source/drain patterns SD1 may be provided on the active pattern AP. The first channel pattern CH1 may be interposed between the pair of first source/drain patterns SD1. The first channel pattern CH1 may connect the pair of first source/drain patterns SD1 to each other.

The first channel pattern CH1 may include sequentially stacked first to third semiconductor patterns SP1, SP2, and SP3. The first to third semiconductor patterns SP1, SP2, and SP3 may be spaced apart from one another in a vertical direction (i.e., a third direction D3). Each of the first to third semiconductor patterns SP1, SP2, and SP3 may include silicon (Si), germanium (Ge), or silicon germanium (SiGe). According to some example embodiments, each of the first to third semiconductor patterns SP1, SP2, and SP3 may include crystalline silicon such as single-crystal silicon; however, example embodiments are not limited thereto.

The first source/drain patterns SD1 may be provided on both sidewalls of the first to third semiconductor patterns SP1, SP2, and SP3, respectively. Each of the first source/drain patterns SD1 may be or may include an epitaxial pattern, e.g. a homogenous epitaxial pattern or a heterogenous epitaxial pattern, formed from the first to third semiconductor patterns SP1, SP2, and SP3 through a Selective Epitaxial Growth (SEG) process.

The first source/drain patterns SD1 may be doped with impurities, and/or may have impurities incorporated therein, to have a first conductivity type. The first conductivity type may be an N-type or a P-type. In various example embodiments, the first conductivity type may be a P-type. The first source/drain patterns SD1 may include silicon (Si) and/or silicon germanium (SiGe). In some example embodiments, the first source/drain patterns SD1 may include carbon; however, example embodiments are not limited thereto.

A first separation structure CSS may be provided on the first source/drain patterns SD1. A dummy pattern DMP may be provided on the first channel pattern CH1. The first separation structure CSS may separate the first source/drain patterns SD1 from second source/drain patterns SD2 to be described later. The dummy pattern DMP may separate the first channel pattern CH1 from a second channel pattern CH2 to be described later. Each of the first separation structure CSS and the dummy pattern DMP may include at least one of silicon oxide, silicon nitride, and silicon oxynitride. In some example embodiments, the first separation structure CSS and the dummy pattern DMP may include different insulating materials from each other, and may not include the same material as each other.

The second active region AR2 including the second channel pattern CH2 and the pair of second source/drain patterns SD2 may be provided on the first active region AR1. The second channel pattern CH2 may be interposed between the pair of second source/drain patterns SD2. The second channel pattern CH2 may connect the pair of second source/ drain patterns SD2 to each other. The second channel pattern CH2 may vertically overlap the first channel pattern CH1. The second source/drain patterns SD2 may vertically overlap the first source/drain patterns SD1, respectively.

The second channel pattern CH2 may include sequentially stacked fourth to sixth semiconductor patterns SP4, SP5, and SP6. The fourth to sixth semiconductor patterns SP4, SP5, and SP6 may be spaced apart from one another in the third direction D3. The fourth to sixth semiconductor patterns SP4, SP5, and SP6 of the second channel pattern CH2 may include the same semiconductor material as a semiconductor material of the first to third semiconductor patterns SP1, SP2, and SP3 of the first channel pattern CH1 described above, and may or may not include different materials from one another. The above-described dummy pattern DMP may be interposed between the first channel pattern CH1 and the second channel pattern CH2 disposed thereon. The dummy pattern DMP may be or correspond to a dummy channel pattern, e.g. a channel pattern that is not electrically active.

The second source/drain patterns SD2 may be provided on both sidewalls of the fourth to sixth semiconductor patterns SP4, SP5, and SP6, respectively. Each of the second source/drain patterns SD2 may be an epitaxial pattern formed from the fourth to sixth semiconductor patterns SP4, SP5, and SP6 through a Selective Epitaxial Growth (SEG) process.

The second source/drain patterns SD2 may be doped with impurities to have a second conductivity type. The second conductivity type may be different from the first conductivity type of the first source/drain pattern SD1. In various example embodiments, the second conductivity type may be an N-type conductivity type, and may include, e.g., phosphorus and/or arsenic at a concentration much greater than a concentration of any P-type dopant. The second source/drain patterns SD2 may include silicon germanium (SiGe) and/or silicon (Si) (e.g., epitaxial silicon).

A first separation structure CSS may be provided on the second source/drain patterns SD2. A dummy pattern DMP may be provided on the second channel pattern CH2. The third active region AR3 including a third channel pattern CH3 and a pair of third source/drain patterns SD3 may be provided on the second active region AR2.

The third channel pattern CH3 may include sequentially stacked seventh to ninth semiconductor patterns SP7, SP8, and SP9. The third source/drain patterns SD3 may be provided on both sidewalls of the seventh to ninth semiconductor patterns SP7, SP8, and SP9, respectively. The third source/drain patterns SD3 may have the first conductivity type. Detailed descriptions of the third channel pattern CH3 and the third source/drain patterns SD3 may be substantially the same as those described above with respect to the first channel pattern CH1 and the first source/drain patterns SD1.

A first separation structure CSS may be provided on the third source/drain patterns SD3. A dummy pattern DMP may be provided on the third channel pattern CH3. A fourth active region AR4 including a fourth channel pattern CH4 and a pair of fourth source/drain patterns SD4 may be provided on the third active region AR3.

The fourth channel pattern CH may include sequentially stacked tenth to twelfth semiconductor patterns SP10, SP11, and SP12. The fourth source/drain patterns SD4 may be provided on both sidewalls of the tenth to twelfth semiconductor patterns SP10, SP11, and SP12, respectively. The fourth source/drain patterns SD4 may have the second conductivity type. Detailed descriptions of the fourth channel pattern CH4 and the fourth source/drain patterns SD4 may be substantially the same as those described above with respect to the second channel pattern CH2 and the second source/drain patterns SD2.

A second insulating layer ILD2 may be provided on the fourth active region AR4. A top surface of the second insulating layer ILD2 may be coplanar with a top surface of each of contact lines CTL1 to CTL6 to be described later.

Figure 5A:
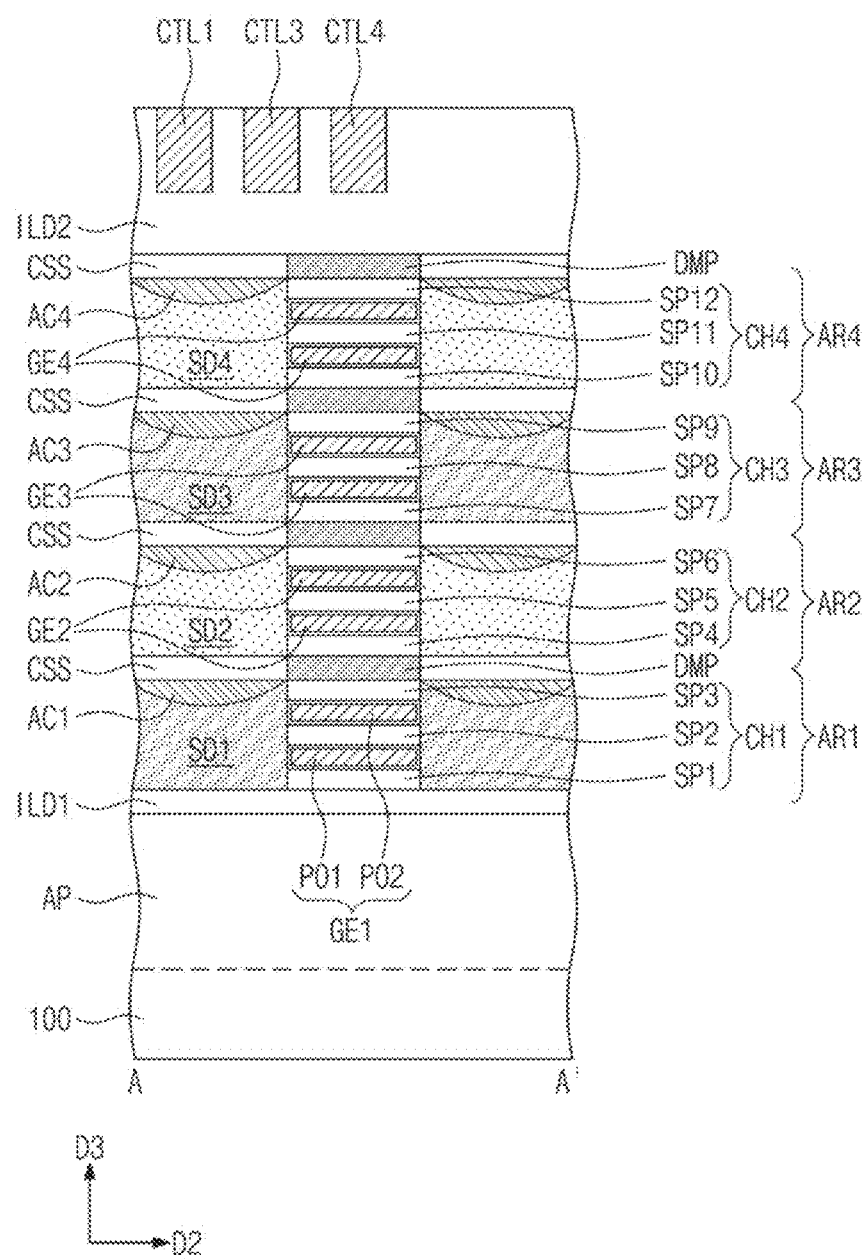
FIGS. 5A to 5D are cross-sectional views taken along line A-A', line B-B', line C-C', and line D-D' of FIG. 4, respectively.
Figure 5B:
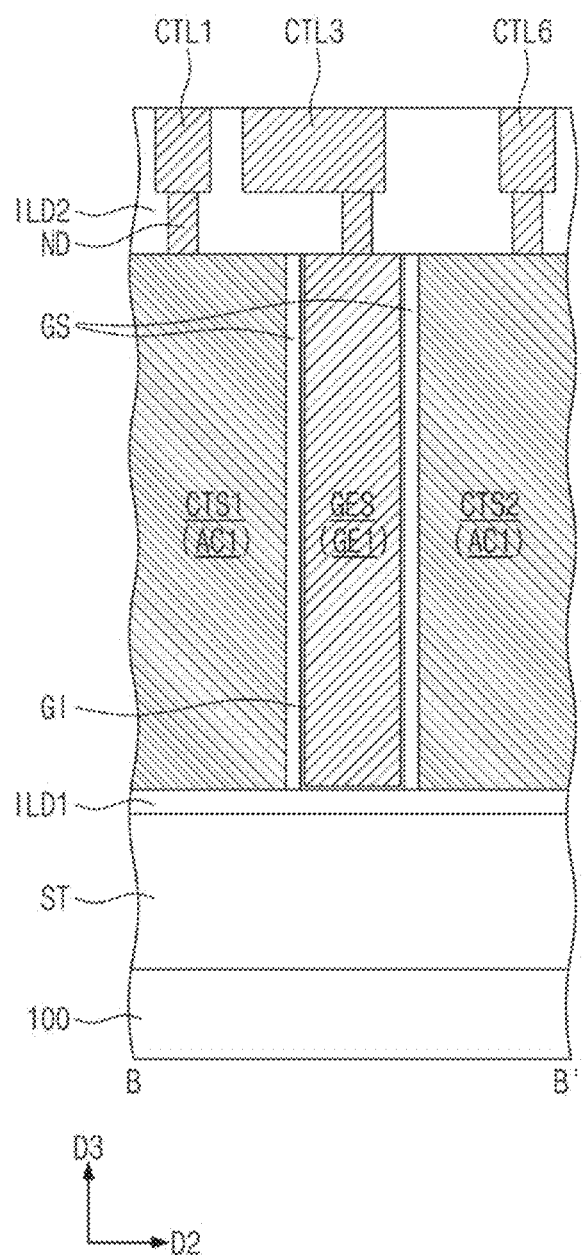

First to fourth gate electrodes GE1 to GE4 may be respectively provided on the stacked first to fourth channel patterns CH1 to CH4. For example, referring to FIG. 5C, the first gate electrode GE1 may be provided on a top surface and a first and a second sidewall (both sidewalls) of the first semiconductor pattern SP1. The first gate electrode GE1 may be provided on a top surface, a bottom surface, and both sidewalls of the second semiconductor pattern SP2. The first gate electrode GE1 may be provided on a bottom surface and both sidewalls of the third semiconductor pattern SP3. Referring to FIG. 5A, the first gate electrode GE1 may include a first portion PO1 interposed between the first semiconductor pattern SP1 and the second semiconductor pattern SP2 and a second portion interposed between the second semiconductor pattern SP2 and the three semiconductor patterns SP3.

The second gate electrode GE2 may be provided on the fourth to sixth semiconductor patterns SP4 to SP6 in a manner similar to that of the first gate electrode GE1. The third gate electrode GE3 may be provided on the seventh to ninth semiconductor patterns SP4 to SP9 in a manner similar to that of the first gate electrode GE1. The fourth gate electrode GE4 may be provided on the tenth to twelfth semiconductor patterns SP10 to SP12 in a manner similar to that of the first gate electrode GE1. Transistor according to various example embodiments may include a three dimensional field effect transistor (e.g., MBCFET™ and/or GAAFET) in which a gate electrode surrounds a channel three-dimensionally.

The first to fourth gate electrodes GE1 to GE4 adjacent to each other may be spaced apart from each other based on a second separation structure GSS interposed therebetween. For example, the second separation structure GSS may separate the first gate electrode GE1 and the second gate electrode GE2 from each other. The second separation structure GSS may separate the second gate electrode GE2 and the third gate electrode GE3 from each other. The second separation structure GSS may separate the third gate electrode GE3 and the fourth gate electrode GE4 from each other. The second separation structure GSS may include at least one of silicon oxide, silicon nitride, and silicon oxynitride.

Figure 5C:
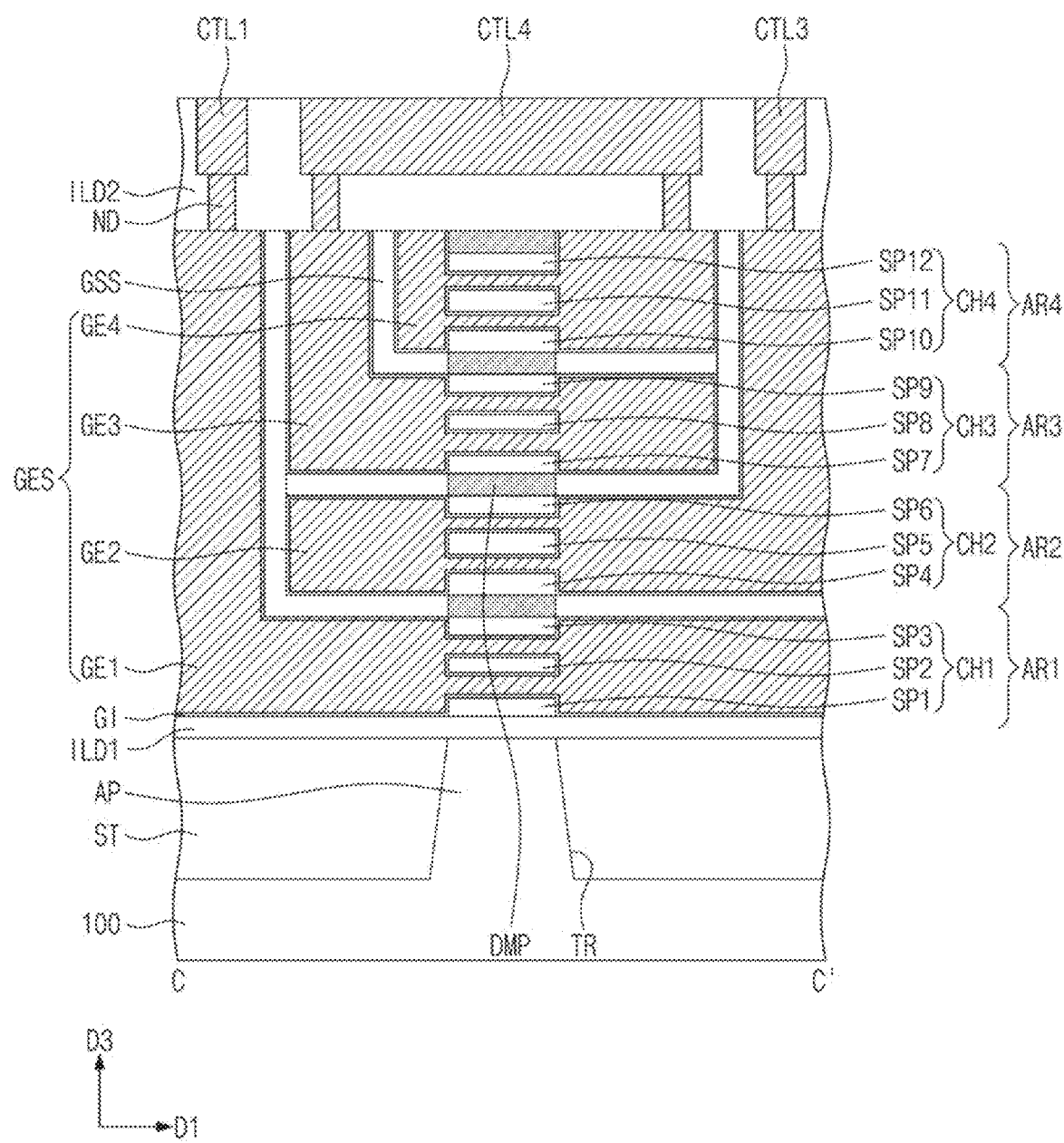

The first to fourth gate electrodes GE1 to GE4 may be stacked to form one gate structure GES (refer to FIG. 5C). A pair of gate spacers GS may be respectively disposed or arranged on both sidewalls of the gate structure GES (refer to FIG. 5B).

The gate spacers GS may extend along the gate structure GES in a first direction D1. Top surfaces of the gate spacers GS may be coplanar with a top surface of the gate structure GES. The gate spacers GS may include at least one of SiCN, SiCON, and SiN.

Alternatively or additionally, the gate spacers GS may include a multi-layer including at least two of SiCN, SiCON, and SiN.

Gate insulating layers GI may be interposed between the first to fourth gate electrodes GE1 to GE4 and the first to fourth channel patterns CH1 to CH4, respectively. For example, the gate insulating layer GI may be interposed between the first gate electrode GE1 and the first to third semiconductor patterns SP1 to SP3. The gate insulating layer GI may cover or directly cover surfaces of the first to third semiconductor patterns SP1 to SP3 facing the first gate electrode GE1.

The gate insulating layer GI may include a silicon oxide layer, a silicon oxynitride layer, and/or a high dielectric layer. In some example embodiments of inventive concepts, the gate insulating layer GI may include a silicon oxide layer directly covering the surfaces of the semiconductor patterns SP1 to SP12 and a high dielectric layer on the silicon oxide layer. For example, the gate insulating layer GI may be multi-layer or include multiple layers.

The high dielectric layer may include a high dielectric material having a dielectric constant greater than that of the silicon oxide layer. For example, the high dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Each of the first to fourth gate electrodes GE1 to GE4 may include a first metal pattern and a second metal pattern on the first metal pattern. The first metal pattern may be provided on the gate insulating layer GI and may be adjacent to the corresponding semiconductor patterns SP1 to SP12. The first metal pattern may include a work function metal adjusting a threshold voltage of the transistor. A certain threshold voltage of the transistor may be achieved, for example, by adjusting a thickness and/or composition of the first metal pattern. For example, the first and second portions PO1 and PO2 of the first gate electrode GE1 may be formed of the first metal pattern, which is or includes a work function metal.

The first metal pattern may include a metal nitride layer. For example, the first metal pattern may include at least one metal selected from the group consisting of titanium (Ti), tantalum (Ta), aluminum (Al), tungsten (W), and molybdenum (Mo) and nitrogen (N). Furthermore, the first metal pattern may further include carbon (C). The first metal pattern may include a plurality of stacked work function metal layers.

The second metal pattern may include a metal having a lower resistance than that of the first metal pattern. For example, the second metal pattern may include at least one metal selected from the group consisting of tungsten (W), aluminum (Al), titanium (Ti), and tantalum (Ta). For example, a vertical extension to be described later, of each of the first to fourth gate electrodes GE1 to GE4 may be formed of the second metal pattern.

Figure 5D:
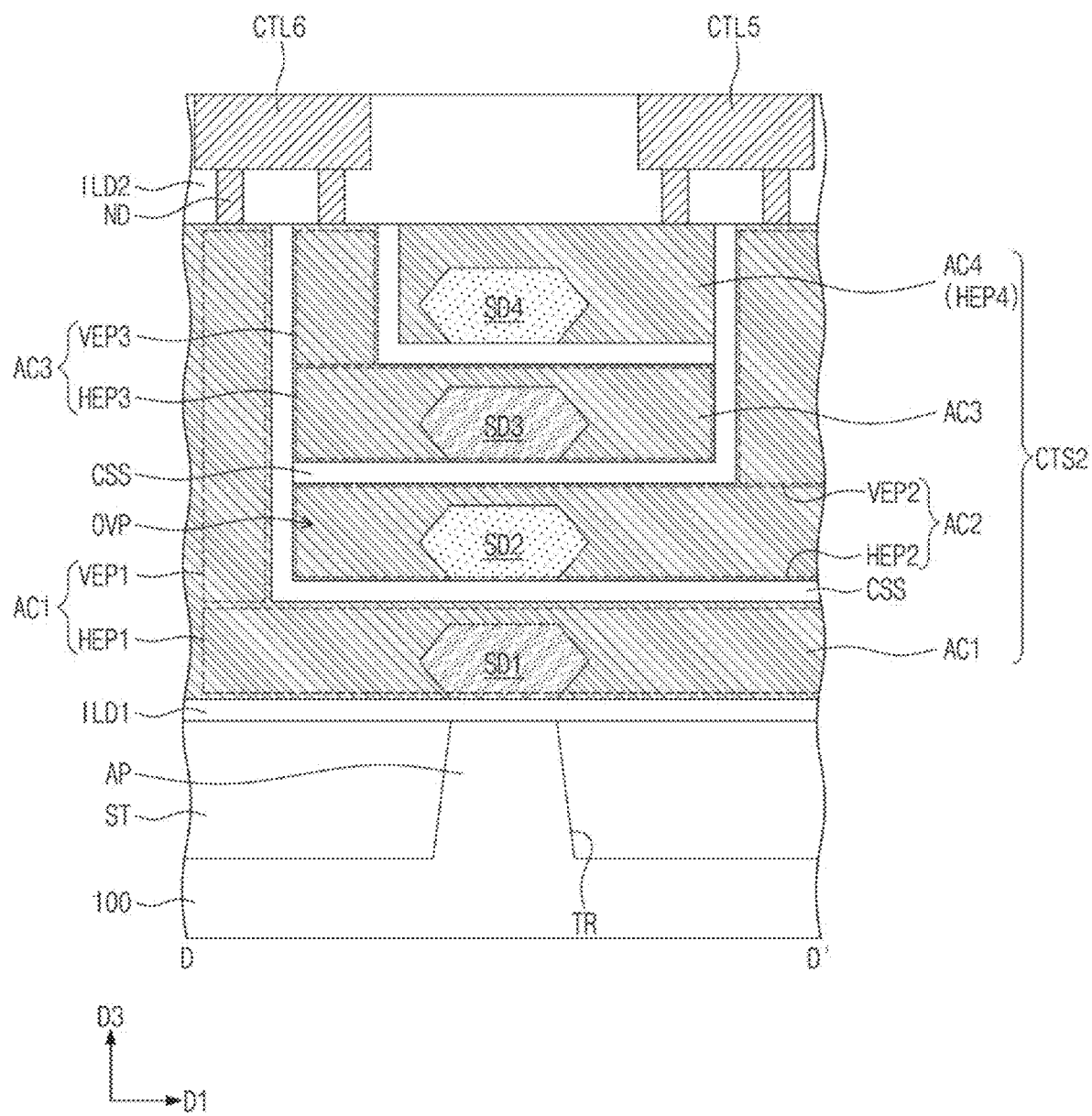

Referring to FIGS. 4 and 5D, first to fourth active contacts AC1 to AC4 may be provided on the stacked first to fourth source/drain patterns SD1 to SD4, respectively. The first to fourth active contacts AC1 to AC4 may be directly provided on the first to fourth source/drain patterns SD1 to SD4. The first to fourth active contacts AC1 to AC4 may be electrically connected to the first to fourth source/drain patterns SD1 to SD4, respectively. In some example embodiments, metal silicide layers may be respectively interposed between the first to fourth active contacts AC1 to AC4 and the first to fourth source/drain patterns SD1 to SD4. The first to fourth active contacts AC1 to AC4 may include at least one metal selected from the group consisting of copper (Cu), aluminum (Al), ruthenium (Ru), cobalt (Co), tungsten (W), and molybdenum (Mo).

A first separation structure CSS may be provided between the first to fourth active contacts AC1 to AC4 adjacent to each other. Accordingly, the first to fourth active contacts AC1 to AC4 may be spaced apart from one another without being in contact with each other. For example, the first separation structure CSS may separate the first active contact AC1 and the second active contact AC2 from each other. The first separation structure CSS may separate the second active contact AC2 and the third active contact AC3 from each other. The first separation structure CSS may separate the third active contact AC3 and the fourth active contact AC4 from each other.

Referring to FIG. 5D, the first active contact AC1 may include a first horizontal extension part HEP1 and a first vertical extension part VEP1. The first horizontal extension part HEP1 may be provided at the same level as the first source/drain pattern SD1. The first horizontal extension part HEP1 may be disposed in the first tier. The first horizontal extension part HEP1 may be directly connected to the first source/drain pattern SD1. An extension direction of the first horizontal extension part HEP1 may be parallel to the first direction D1.

The first vertical extension part VEP1 may extend from the first horizontal extension part HEP1 in a vertical direction, that is, in the third direction D3. An extension direction of the first vertical extension part VEP1 may be parallel to the third direction D3. The first vertical extension part VEP1 may extend from the first horizontal extension part HEP1 to an uppermost portion of the fourth active region AR4. For example, the first vertical extension part VEP1 may extend from the first tier to the fourth tier.

The cross-section of the first active contact AC1 along the line D-D' of FIG. 4 may have an L-shape by the first horizontal extension part HEP1 and the first vertical extension part VEP1. In some example embodiments of inventive concepts, the first horizontal extension part HEP1 and the first vertical extension part VEP1 may include the same metal material. Accordingly, the first horizontal extension part HEP1 and the first vertical extension part VEP1 may be integrally connected to each other to form the first active contact AC1. For example, a physical boundary between the first horizontal extension part HEP1 and the first vertical extension part VEP1 may not exist. The first separation structure CSS on the first active contact AC1 may have an L-shape along the first horizontal extension part HEP1 and the first vertical extension part VEP1.

The second active contact AC2 may include a second horizontal extension part HEP2 and a second vertical extension part VEP2. The second horizontal extension part HEP2 may be provided at the same level as the second source/drain pattern SD2. The second horizontal extension part HEP2 may be stacked on the first horizontal extension part HEP1 and may be disposed in the second tier. The second horizontal extension part HEP2 may be directly connected to the second source/drain pattern SD2. An extension direction of the second horizontal extension part HEP2 may be parallel to the first direction D1.

The second vertical extension part VEP2 may extend from the second horizontal extension part HEP2 in a vertical direction, that is, in the third direction D3. The second vertical extension part VEP2 may extend from the second horizontal extension part HEP2 to an uppermost portion of the fourth active region AR4. For example, the second vertical extension part VEP2 may extend from the second tier to the fourth tier. A top surface of the second vertical extension part VEP2 may be disposed at the same level as a top surface of the first vertical extension part VEP1.

The second vertical extension part VEP2 may be provided on the opposite side of the first vertical extension part VEP1 based on the sequentially stacked first to fourth source/drain patterns SD1 to SD4. For example, the first vertical extension part VEP1 may be spaced apart from the second vertical extension part VEP2 in the first direction D1 with the stacked first to fourth source/drain patterns SD1 to SD4 interposed therebetween. The first vertical extension part VEP1 may be provided to be adjacent to one side of the stacked first to fourth source/drain patterns SD1 to SD4. The second vertical extension part VEP2 may be provided to be adjacent to the other side of the stacked first to fourth source/drain patterns SD1 to SD4. The one side and the other side of the stacked first to fourth source/drain patterns SD1 to SD4 may be opposite to each other in the first direction D1.

A second contact structure CTS2 to be described later may include a first sidewall and a second sidewall facing the first sidewall in the first direction D1. The first vertical extension part VEP1 may be adjacent to the first sidewall of the second contact structure CTS2. The second vertical extension part VEP2 may be adjacent to the second sidewall of the second contact structure CTS2.

Referring to FIG. 4, a via ND connected to the first active contact AC1 may be disposed in a first row RW1, and a via ND connected to the second active contact AC2 may be disposed in a fourth row RW4. The first row RW1 and the fourth row RW4 may be spaced apart from each other in the first direction D1 with the stacked first to fourth active regions AR1 to AR4 interposed therebetween.

Referring back to FIG. 5D, the third active contact AC3 may include a third horizontal extension part HEP3 and a third vertical extension part VEP3. The third horizontal extension part HEP3 may be provided at the same level as the third source/drain pattern SD3. The third horizontal extension part HEP3 is stacked on the second horizontal extension part HEP2 and may be disposed in the third tier. The third horizontal extension part HEP3 may be directly connected to the third source/drain pattern SD3. An extension direction of the third horizontal extension part HEP3 may be parallel to the first direction D1.

The third vertical extension part VEP3 may extend from the third horizontal extension part HEP3 in a vertical direction, for example, in the third direction D3. The third vertical extension part VEP3 may extend from the third horizontal extension part HEP3 to an uppermost portion of the fourth active region AR4. For example the third vertical extension part VEP3 may extend from the third tier to the fourth tier. A top surface of the third vertical extension part VEP3 may be disposed at the same level as the top surface of the first vertical extension part VEP1.

The third vertical extension part VEP3 may be adjacent to the first vertical extension part VEP1 with the first separation structure CSS interposed therebetween. The third vertical extension part VEP3 may be spaced apart from the second vertical extension part VEP2 in the first direction D1 with the stacked first to fourth source/drain patterns SD1 to SD4 interposed therebetween.

In the third active contact AC3 according to various example embodiments, the third horizontal extension part HEP3 may be adjacent to the second active contact AC2 (i.e., the second horizontal extension part HEP2), but the third vertical extension part VEP3 may be adjacent to the first active contact AC1 (i.e., the first vertical extension part VEP1).

For example, the second horizontal extension part HEP2 of the above-described second active contact AC2 may include an overlapping portion OVP that vertically overlaps the third vertical extension part VEP3. The overlapping portion OVP may be adjacent to one end of the second horizontal extension part HEP2. According to some example embodiments of inventive concepts, the first active contact AC1 as well as the second active contact AC2 may include an overlapping portion OVP in which the first horizontal extension part HEP1 vertically overlaps the second vertical extension part VEP2.

The fourth active contact AC4 may include a fourth horizontal extension part HEP4. The fourth horizontal extension part HEP4 may be provided at the same level as the fourth source/drain pattern SD4. The fourth horizontal extension part HEP4 may be stacked on the third horizontal extension part HEP3 and may be disposed in the fourth tier. The fourth horizontal extension part HEP4 may be directly connected to the fourth source/drain pattern SD4. An extension direction of the fourth horizontal extension part HEP4 may be parallel to the first direction D1.

According to some example embodiments of inventive concepts, a vertical extension part may be omitted from the fourth active contact AC4. For example, a top surface of the fourth horizontal extension part HEP4 may be provided at the same level as top surfaces of the first to third vertical extension parts VEP1, VEP2, and VEP3. The via ND may be directly connected to the top surface of the fourth horizontal extension part HEP4. The fourth active contact AC4 may be interposed between the second vertical extension part VEP2 and the third vertical extension part VEP3.

The first to fourth active contacts AC1 to AC4 according to inventive concepts may be alternately stacked in an L-shape and an inverted L-shape. Accordingly, pad regions (e.g., nodes) to which the vias ND are capable of being connected may be respectively disposed on the first to fourth rows RW1 to RW4 of the logic cell LC (refer to FIG. 4). For example, the nodes capable of applying a signal to each of the first to fourth source/drain patterns SD1 to SD4 may be respectively disposed on the first to fourth rows RW1 to RW4 of the logic cell LC.

Referring back to FIG. 5C, the first to fourth gate electrodes GE1 to GE4 of the gate structure GES may have structures similar to those of the first to fourth active contacts AC1 to AC4 described above, respectively. For example, each of the first to third gate electrodes GE1, GE2, and GE3 may respectively have an L-shape including a horizontal extension part and a vertical extension part.

The first to fourth gate electrodes GE1 to GE4 may be alternately stacked in an L-shape and an inverted L-shape. Accordingly, pad regions (i.e., nodes) to which the vias ND are capable of being connected may be respectively disposed on the first to fourth rows RW1 to RW4 of the logic cell LC (refer to FIG. 4).

Referring back to FIG. 4, the gate structure GES, a first contact structure CTS1, and the second contact structure CTS2 may be provided on the stacked first to fourth active regions AR1 to AR4. The gate structure GES may be interposed between the first and second contact structures CTS1 and CTS2.

Each of the first and second contact structures CTS1 and CTS2 may include the first to fourth active contacts AC1 to AC4 described above with reference to FIG. 5D. The gate structure GES may include the first to fourth gate electrodes GE1 to GE4 described above with reference to FIG. 5C.

Each of the gate structure GES, the first contact structure CTS1, and the second contact structure CTS2 may include pad regions (e.g., nodes) where the vias ND are capable of being disposed on the first to fourth rows RW1 to RW4.

In each of the first and second contact structures CTS1 and CTS2, the pad regions may respectively correspond to top surfaces of the first to third vertical extension parts VEP1 to VEP3. For example, a top surface of the first vertical extension part VEP1 may be disposed at the first row RW1 as a first pad region, a top surface of the second vertical extension part VEP2 may be disposed at the fourth row RW4 as a second pad region, and a top surface of the third extension part VEP3 may be disposed at the second row RW2 as a third pad region. A top surface of the fourth horizontal extension part HEP4 may be disposed at the third row RW3 as a fourth pad region.

The gate structure GES may also include pad regions respectively disposed in the first to fourth rows RW1 to RW4. A top surface of the vertical extension part of the first gate electrode GE1 may be disposed at the first row RW1 as a first pad region, a top surface of the vertical extension part of the second gate electrode GE2 may be disposed at the fourth row RW4 as a second pad region, and a top surface of the vertical extension part of the third gate electrode GE3 may be disposed at the second row RW2 as a third pad region. A top surface of the fourth gate electrode GE4 may be disposed at the third row RW3 as a fourth pad region.

According to inventive concepts, the first to fourth active regions AR1 to AR4 arranged two dimensionally shown in FIG. 1 may be vertically stacked, and thus a three dimensional logic cell LC having a reduced cell height may be implemented. According to some example embodiments of inventive concepts, the stacked first to fourth transistors corresponding to the stacked first to fourth active regions AR1 to AR4 may input/output signals through nodes two-dimensionally arranged on the first to fourth rows RW1 to RW4.

Referring to FIGS. 3, 4, and 5A to 5D, the second insulating layer ILD2 may be provided on the gate structure GES, the first contact structure CTS1, and the second contact structure CTS2. The first to sixth contact lines CTL1 to CTL6 may be provided in the second insulating layer ILD2. Each of the first to sixth contact lines CTL1 to CTL6 may be connected to one of nodes on the first to fourth rows RW1 to RW4 through at least one via ND.

In some example embodiments of inventive concepts, the first contact line CTL1 may be commonly connected to the first, third, and fourth active contacts AC1, AC3, and AC4 of the first contact structure CTS1 through the vias ND. The first contact line CTL1 may be used as an output node OUT. The second contact line CTL2 may be connected to the second active contact AC2 of the first contact structure CTS1 through the via ND. A source voltage VSS may be applied to the second active contact AC2 through the second contact line CTL2.

The third contact line CTL3 may be commonly connected to the first gate electrode GE1 and the second gate electrode GE2. A first voltage V1 may be applied to the first and second gate electrodes GE1 and GE2 through the third contact line CTL3. The fourth contact line CTL4 may be commonly connected to the third gate electrode GE3 and the fourth gate electrode GE4. A second voltage V2 may be applied to the third and fourth gate electrodes GE3 and GE4 through the fourth contact line CTL4.

The fifth contact line CTL5 may be commonly connected to the second active contact AC2 and the fourth active contact AC4 of the second contact structure CTS2. An NMOS of the second active region AR2 and an NMOS of the fourth active region AR4 may be connected in series through the fifth contact line CTL5.

The sixth contact line CTL6 may be commonly connected to the first active contact AC1 and the third active contact AC3 of the second contact structure CTS2. A drain voltage VDD may be applied to the first and third active contacts AC1 and AC3 through the sixth contact line CTL6.

Although not shown, metal layers such as M1, M2, and M3 may be stacked on the second insulating layer ILD2. Each of the metal layers may include metal wirings. The metal wirings in the metal layers may be electrically connected to the first, second, third, fourth, and sixth contact lines CTL1, CTL2, CTL3, CTL4, and CTL6. The second contact line CTL2 may be electrically connected to the second power line POR2 (VSS) described with reference to FIG. 2, and the sixth contact line CTL6 may be electrically connected to the first power line POR1 (VDD) described with reference to FIG. 2.

Figure 6:
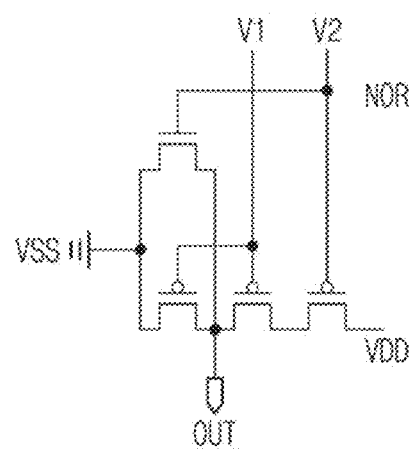
FIG. 6 is a circuit diagram of a NOR according to some example embodiments of inventive concepts.

FIG. 6 is a circuit diagram of a NOR according to some example embodiments of inventive concepts. Referring to FIG. 6, the three dimensional logic cell LC described with reference to FIGS. 4 and 5A to 5D may be equally applied to the NOR cell of FIG. 6 as well as the NAND cell of FIG. 3. In a case of the NOR cell according to various example embodiments, the first and third active regions AR1 and AR3 may be NMOSFET regions including NMOS transistors, and the second and fourth active regions AR2 and AR4 may be PMOSFET regions including PMOS transistors. A drain voltage VDD may be applied to the PMOSFET of the second active region AR2 through the second contact line CTL2. A source voltage VSS may be applied to the NMOSFETs of the first and third active regions AR1 and AR3 through the sixth contact line CTL6.

FIGS. 7A to 15B are cross-sectional views for explaining a method of manufacturing a semiconductor device according to some example embodiments of inventive concepts. Specifically, FIGS. 7A, 8A, 9A, 10A, 11A, 12A, 13A, 14A, and 15A are cross-sectional views taken along line A-A' of FIG. 4. FIGS. 7B, 8B, 12B, and 13B are cross-sectional views taken along line C-C' of FIG. 4. FIGS. 9B, 10B, 11B, 14B, and 15B are cross-sectional views taken along line D-D' of FIG. 4.

Figure 7A:
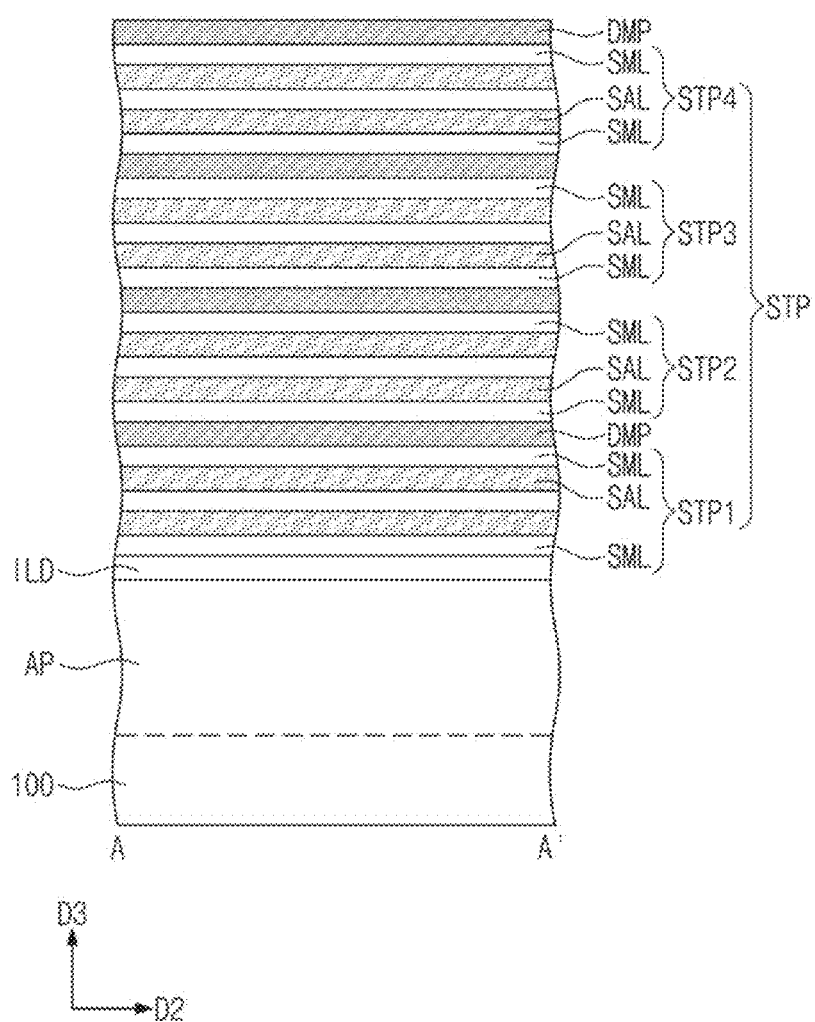
FIGS. 7A to 15B are cross-sectional views for explaining a method of manufacturing a semiconductor device according to some example embodiments of inventive concepts.
Figure 7B:
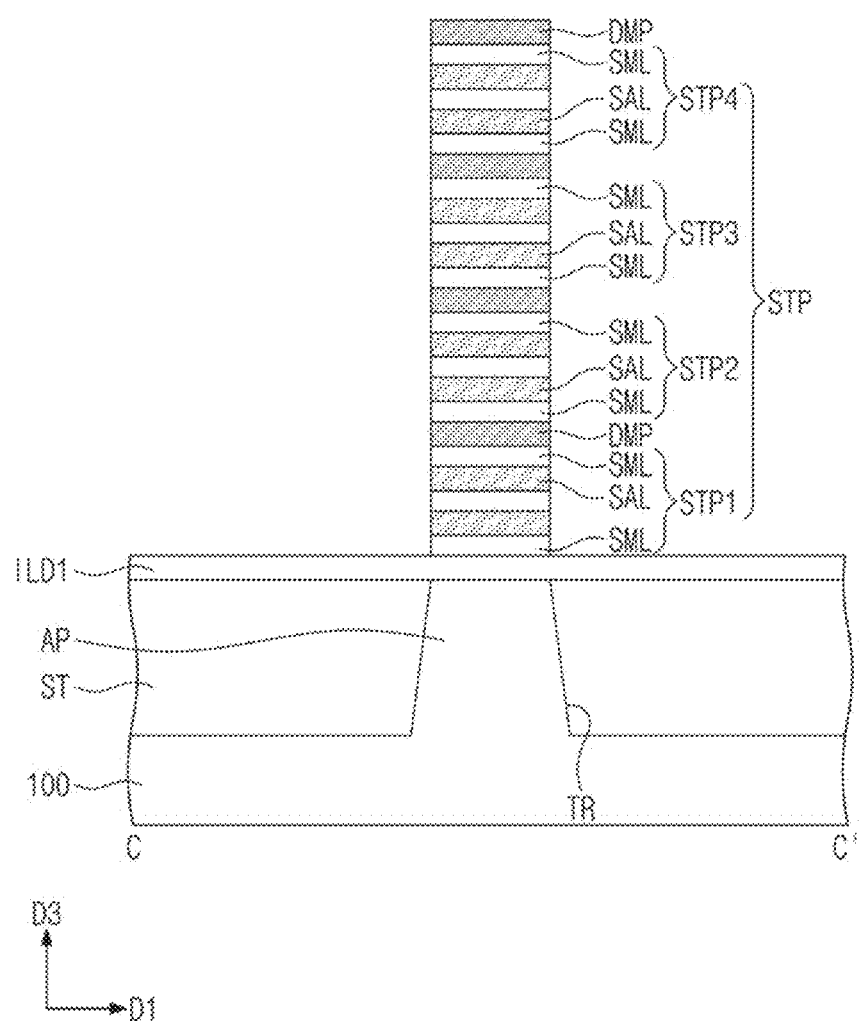

Referring to FIGS. 7A and 7B, an upper part of a substrate 100 may be patterned to form an active pattern AP. A device isolation layer ST covering a sidewall of the active pattern AP may be formed on the substrate 100, e.g. with a process such as a shallow trench isolation (STI) process. A first insulating layer ILD1 may be formed on the device isolation layer ST and the active pattern AP.

A stacked pattern STP may be formed on the active pattern AP. The stacked pattern STP may be formed on a top surface of a first insulating layer ILD1. The stacked pattern STP may be formed in a line shape or a bar shape extending in the second direction D2. In detail, the stacked pattern STP may include first to fourth stacked patterns STP1 to STP4. The first to fourth stacked patterns STP1 to STP4 may be sequentially stacked on the first insulating layer ILD1. The stacked pattern STP may be formed with a deposition process such as an atomic layer deposition (ALD) process. A thickness of each of the stacked semiconductor layers SML may be the same as each other, or different from each other. A thickness of each of the sacrificial layers SAL may be the same as each other, or different from each other, and may be the same as, or different from, the corresponding stacked semiconductor layer SML.

Each of the first to fourth stacked patterns STP1 to STP4 may include alternately stacked semiconductor layers SML and sacrificial layers SAL. The sacrificial layers SAL may include another one of silicon (Si), germanium (Ge), and silicon germanium (SiGe), and the semiconductor layers SML may include silicon (Si), germanium (Ge), and silicon germanium (SiGe). For example, the sacrificial layers SAL may include silicon germanium (SiGe), and the semiconductor layers SML may include silicon (Si). A concentration of germanium (Ge) in each of the sacrificial layers SAL may be 10 at % to 30 at %.

The stacked pattern STP may further include dummy patterns DMP respectively interposed between the adjacent first to fourth stacked patterns STP1 to STP4. For example, a dummy pattern DMP may be interposed between the first and second stacked patterns STP1 and STP2. The dummy pattern DMP may be interposed between the second and third stacked patterns STP2 and STP3. The dummy pattern DMP may be interposed between the third and fourth stacked patterns STP3 and STP4. The dummy pattern DMP may be further provided on the fourth stacked pattern STP4.

The dummy pattern DMP may include a material different from that of the semiconductor layer SML and the sacrificial layer SAL, and may not include any material in the semiconductor layer SML or the sacrificial layer SAL. For example, the dummy pattern DMP may include at least one of silicon oxide, silicon nitride, and silicon oxynitride.

Figure 8A:
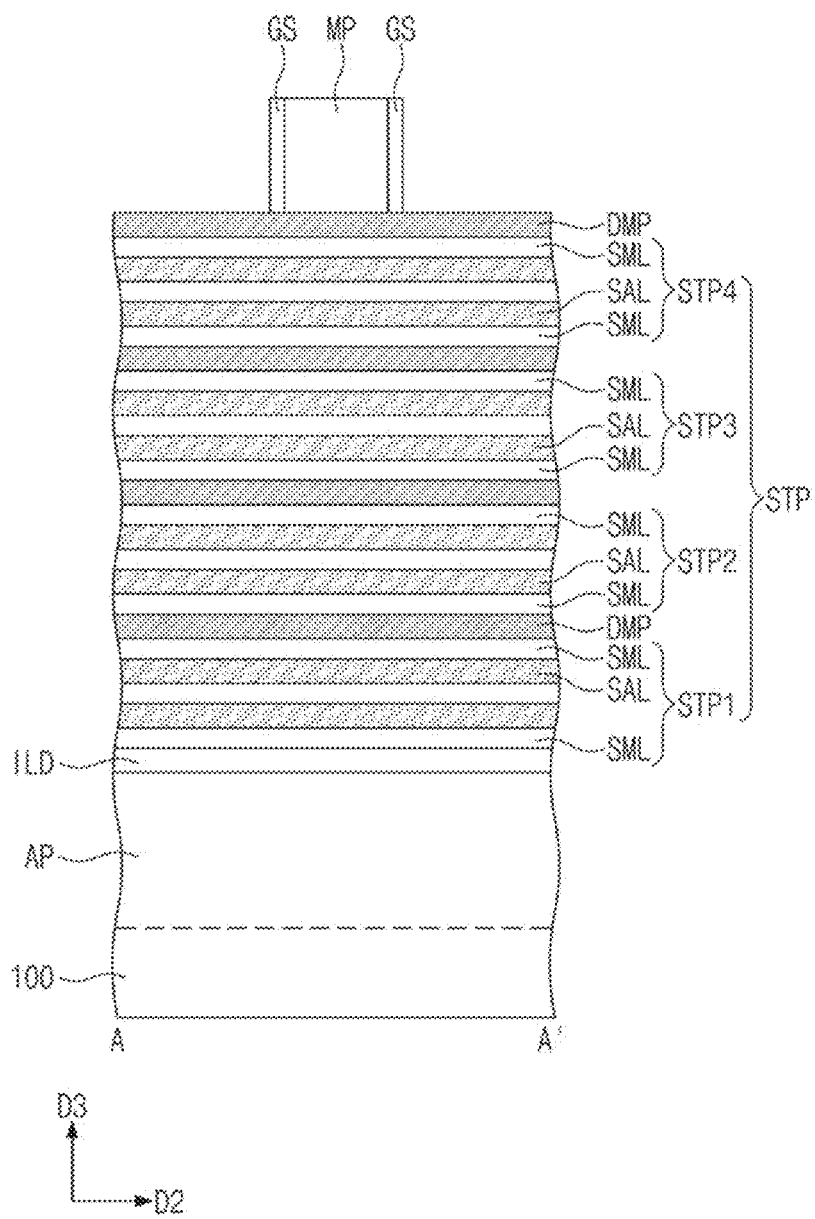
Figure 8B:
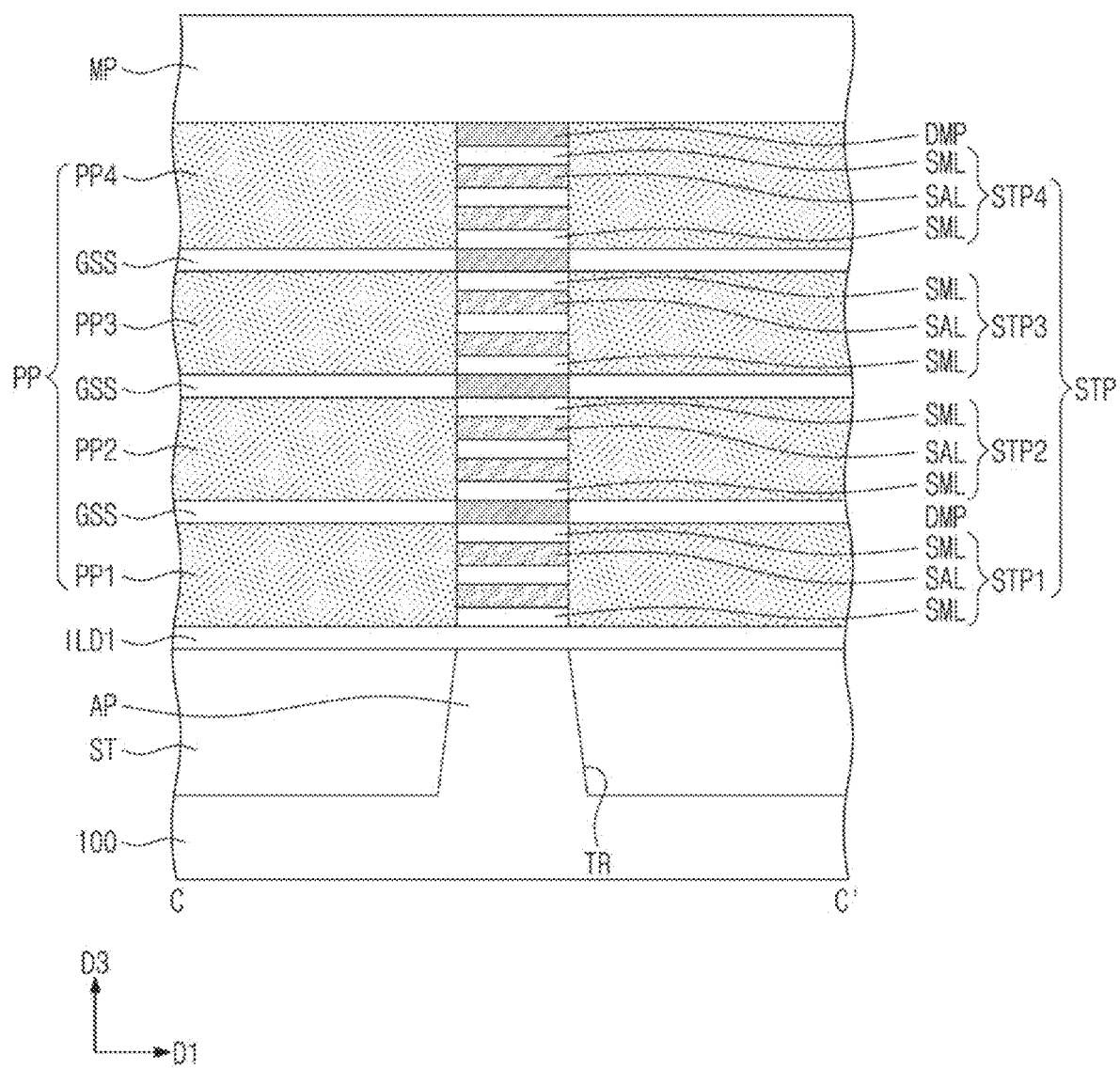

Referring to FIGS. 8A and 8B, a sacrificial structure PP crossing the stacking pattern STP may be formed. The sacrificial structure PP may be formed in a line shape or a bar shape extending in a first direction D1.

In detail, the forming of the sacrificial structure PP may include sequentially stacking first to fourth sacrificial patterns PP1 to PP4 on the first insulating layer ILD1, forming a hard mask MP on the fourth sacrificial pattern PP4, and patterning the first to fourth sacrificial patterns PP1 to PP4 using the hard mask pattern MP as an etch mask. For example, the first to fourth sacrificial patterns PP1 to PP4 may include amorphous silicon and/or polysilicon.

The sacrificial structure PP may include second separation structures GSS respectively interposed between the adjacent first to fourth sacrificial patterns PP1 to PP4. For example, the second separation structure GSS may be interposed between the first and second sacrificial patterns PP1 and PP2. The second separation structure GSS may be interposed between the second and third sacrificial patterns PP2 and PP3. The second separation structure GSS may be interposed between the third and fourth sacrificial patterns PP3 and PP4.

Gate spacers GS may be formed on both sidewalls of each of the sacrificial structure PP and the hard mask pattern MP. The forming of the gate spacers GS may include conformally forming a spacer layer on the entire surface of the substrate 100 and anisotropically etching the spacer layer, e.g. with a dry etching process. For example, the gate spacers GS may include at least one of SiCN, SiCON, and SiN.

Figure 9A:
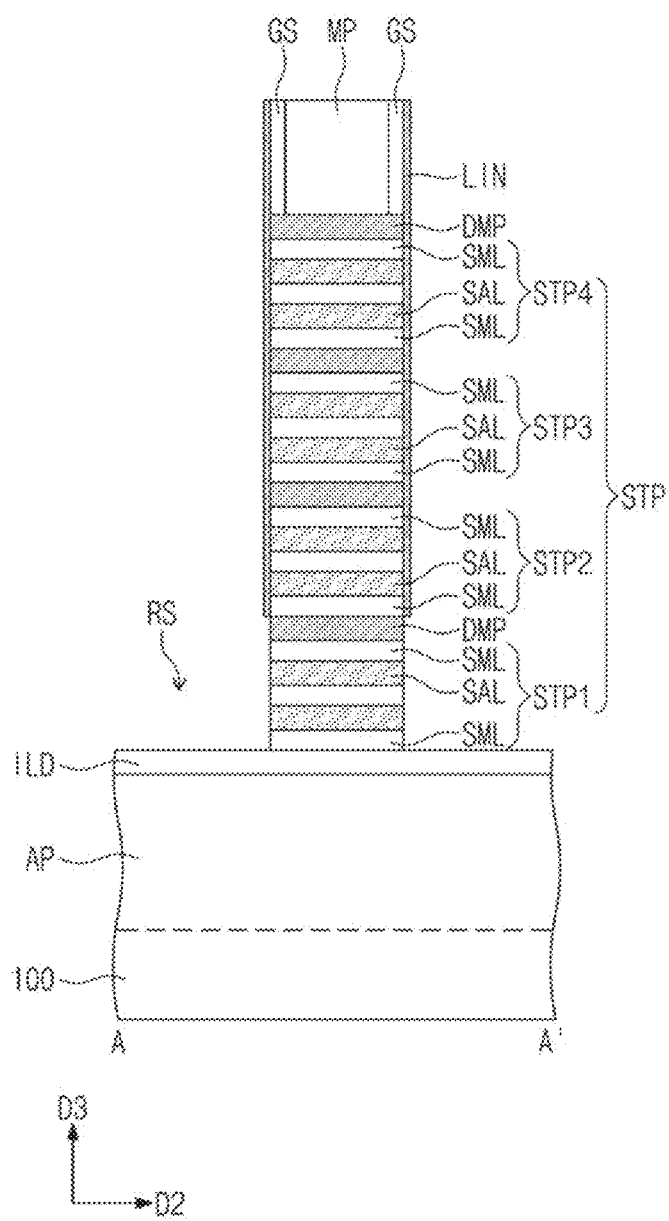
Figure 9B:
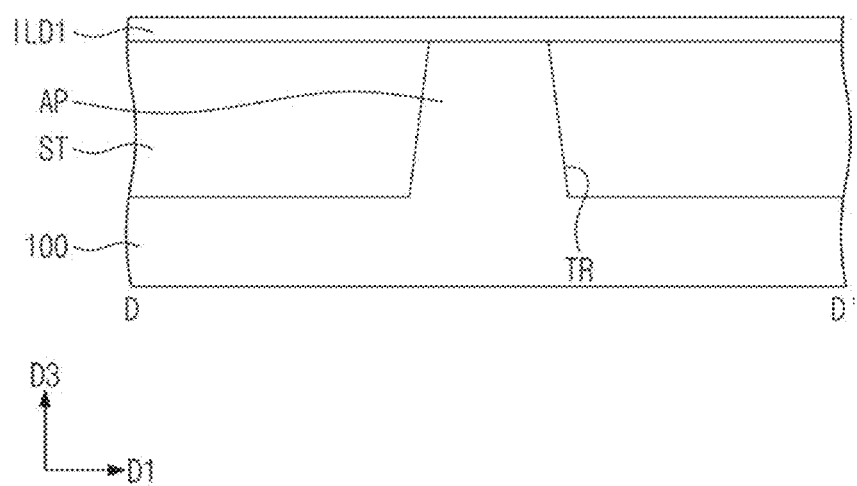

Referring to FIGS. 9A and 9B, the stacked pattern STP may be anisotropically etched using the gate spacers GS and the hard mask pattern MP as an etch mask. Accordingly, recesses RS may be formed at both sides of each of the sacrificial structure PP and the hard mask pattern MP. The recesses RS may expose the semiconductor layers SML of each of the first to fourth stacked patterns STP1 to STP4.

A liner layer LIN may be formed on both sidewalls of the exposed second to fourth stacked patterns STP2, STP3, and STP4. For example, the liner layer LIN may include silicon nitride. The liner layer LIN may not cover the semiconductor layers SML of the first stacked pattern STP1. Accordingly, the semiconductor layers SML of the first stacked pattern STP1 may still be exposed by the recesses RS.

Figure 10A:
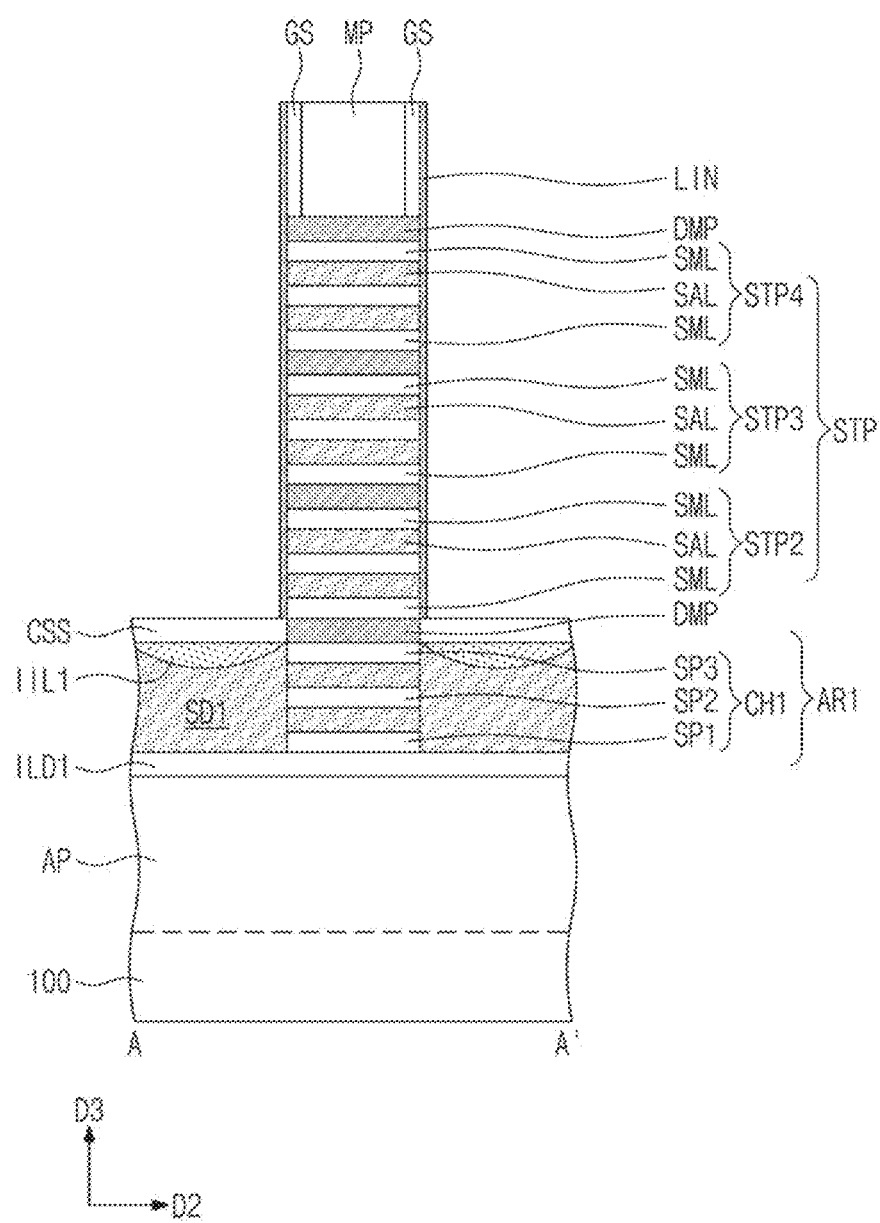
Figure 10B:
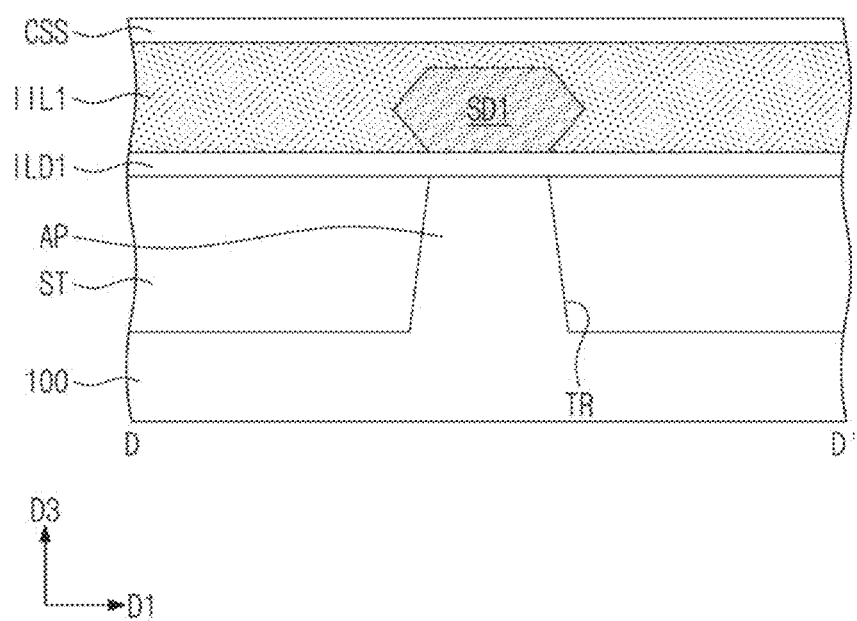

Referring to FIGS. 10A and 10B, first source/drain patterns SD1 may be formed on the exposed semiconductor layers SML of the first stacked pattern STP1. In detail, a first SEG process may be performed using the semiconductor layers SML of the first stacked pattern STP as a seed layer to form the first source/drain pattern SD1. For example, the first SEG process may include a Chemical Vapor Deposition (CVD) process and/or a Molecular Beam Epitaxy (MBE) process.

During the first SEG process on both sidewalls of each of the sacrificial structure PP and the hard mask pattern MP, impurities may be incorporated in-situ into the first source/drain pattern SD1. As another example, after the first source/drain pattern SD1 is formed, impurities may be implanted into the first source/drain pattern SD1. The first source/drain pattern SD1 may be doped to have a first conductivity type (e.g., P-type), for example by inclusion of impurities such as boron.

The semiconductor layers SML of the first stacked pattern STP1 interposed between the pair of first source/drain patterns SD1 may constitute a first channel pattern CH1. For example, first to third semiconductor patterns SP1, SP2, and SP3 of the first channel pattern CH1 may be respectively formed from the semiconductor layers SML of the first stacked pattern STP1. The first channel pattern CH1 and the pair of first source/drain patterns SD1 on both sides of the first channel pattern CH1 may constitute a first active region AR1 which is a first tier of a three dimensional device.

While the first source/drain patterns SD1 are being formed, second to fourth stacked patterns STP2 to STP4 may be covered by the liner layer LIN. In other words, the semiconductor layers SML of the second to fourth stacked patterns STP2 to STP4 may not be exposed by the liner layer LIN during the first SEG process. Accordingly, additional semiconductor layers may not be grown on the second to fourth stacked patterns STP2 to STP4 during the first SEG process.

A first dielectric layer IIL1 covering the first source/drain patterns SD1 may be formed. A first separation structure CSS may be formed on the first dielectric layer TILL A top surface of the first separation structure CSS may be formed at the same level as a top surface of the dummy pattern DMP.

Figure 11A:
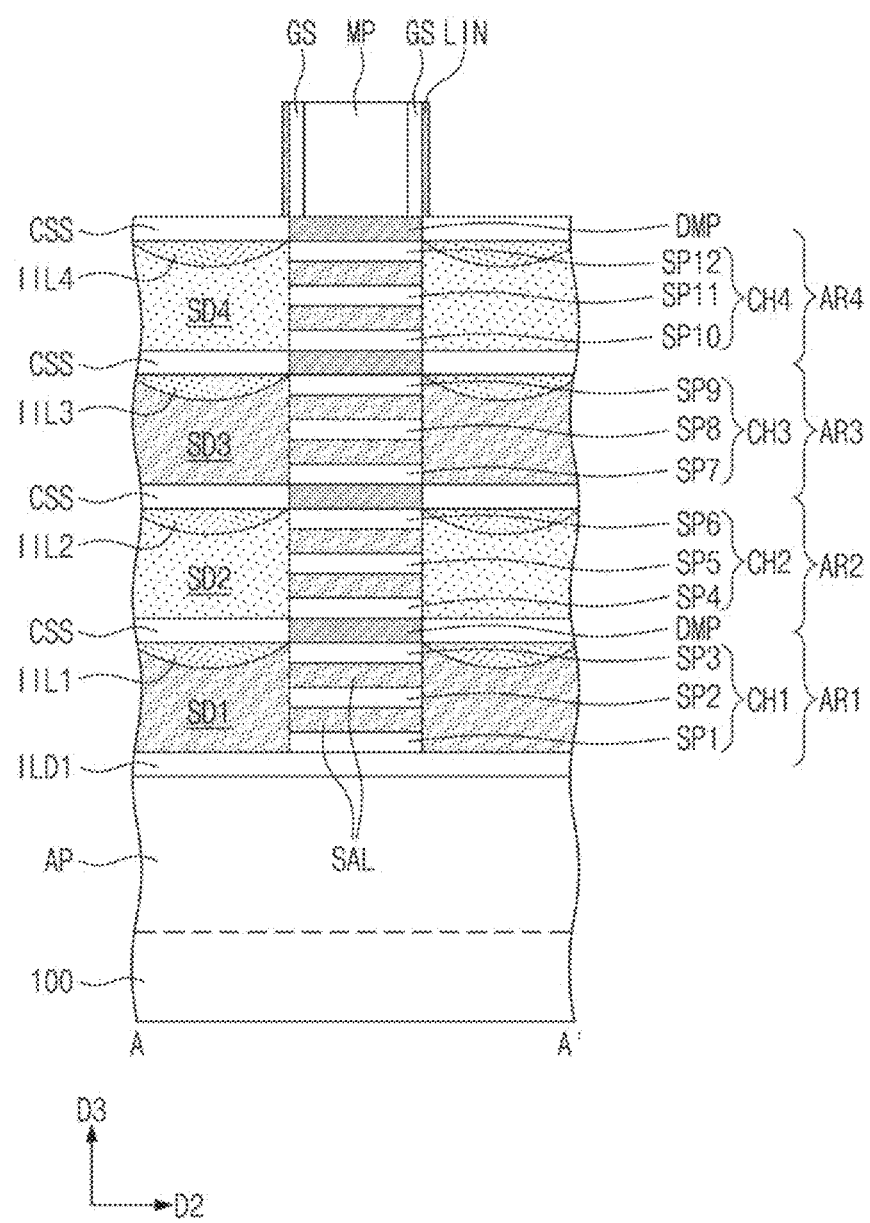
Figure 11B:
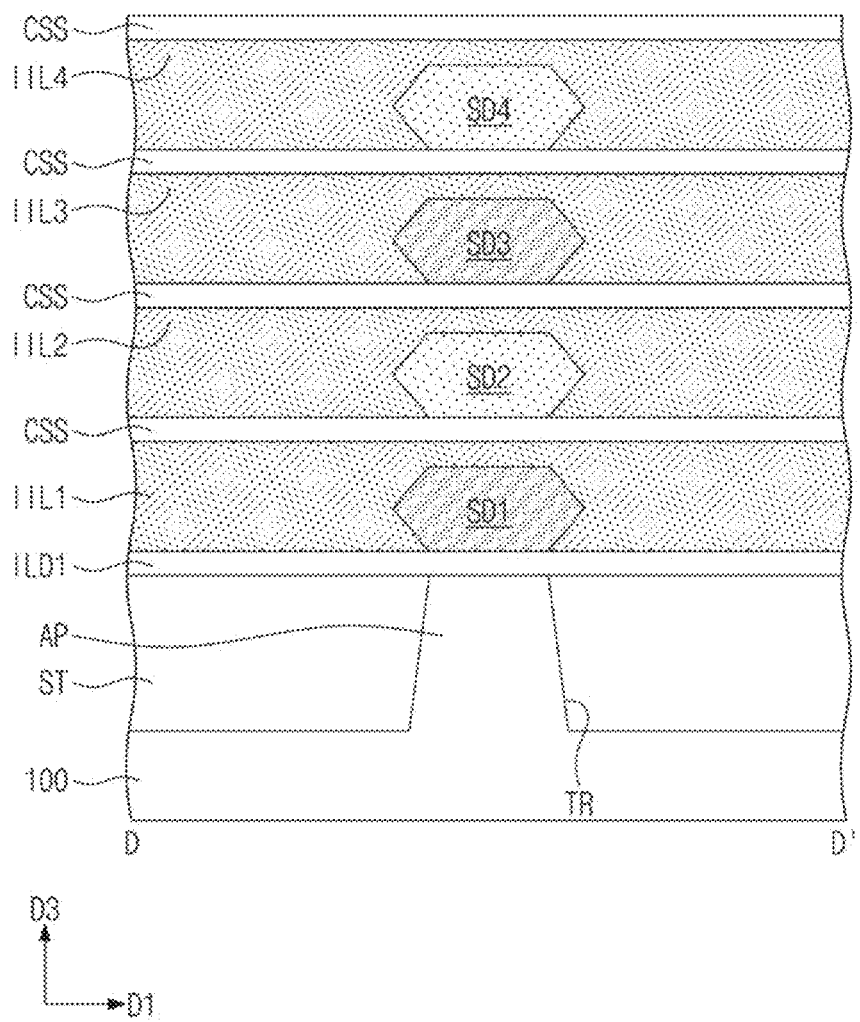

Referring to FIGS. 11A and 11B, a lower portion of the liner layer LIN may be partially removed to selectively expose the semiconductor layers SML of the second stacked pattern STP2. Second source/drain patterns SD2 may be formed through a second SEG process in the same manner as in forming the first source/drain patterns SD1. The second source/drain patterns SD2 may be doped to have a second conductivity type (e.g., N-type), by inclusion of impurities such as arsenic and/or phosphorus.

The semiconductor layers SML of the second stacked pattern STP2 interposed between the pair of second source/drain patterns SD2 may constitute a second channel pattern CH2. For example, fourth to sixth semiconductor patterns SP4, SP5, and SP6 of the second channel pattern CH2 may be respectively formed from the semiconductor layers SML of the second stacked pattern STP2. The second channel pattern CH2 and the pair of second source/drain patterns SD2 on both sides thereof may constitute a second active region AR2 which is a second tier of the three dimensional device.

A second dielectric layer IIL2 covering the second source/drain patterns SD2 may be formed. A first separation structure CSS may be formed on the second dielectric layer IIL2.

By repeating the above-described process, third source/drain patterns SD3 and fourth source/drain patterns SD4 may be sequentially formed. A third channel pattern CH3 and pair of third source/drain patterns SD3 on both sides of the third channel pattern CH3 may constitute a third active region AR3 which is a third tier of the three dimensional device. A fourth channel pattern CH4 and pair of fourth source/drain patterns SD4 on both sides of the fourth channel pattern CH4 may constitute a fourth active region AR4 which is a fourth tier of the three dimensional device.

A third dielectric layer IIL3 covering the third source/drain patterns SD3 may be formed. A first separation structure CSS may be formed on the third dielectric layer IIL3. A fourth dielectric layer IIL4 covering the fourth source/drain patterns SD4 may be formed. A first separation structure CSS may be formed on the fourth dielectric layer IIL4.

Figure 12A:
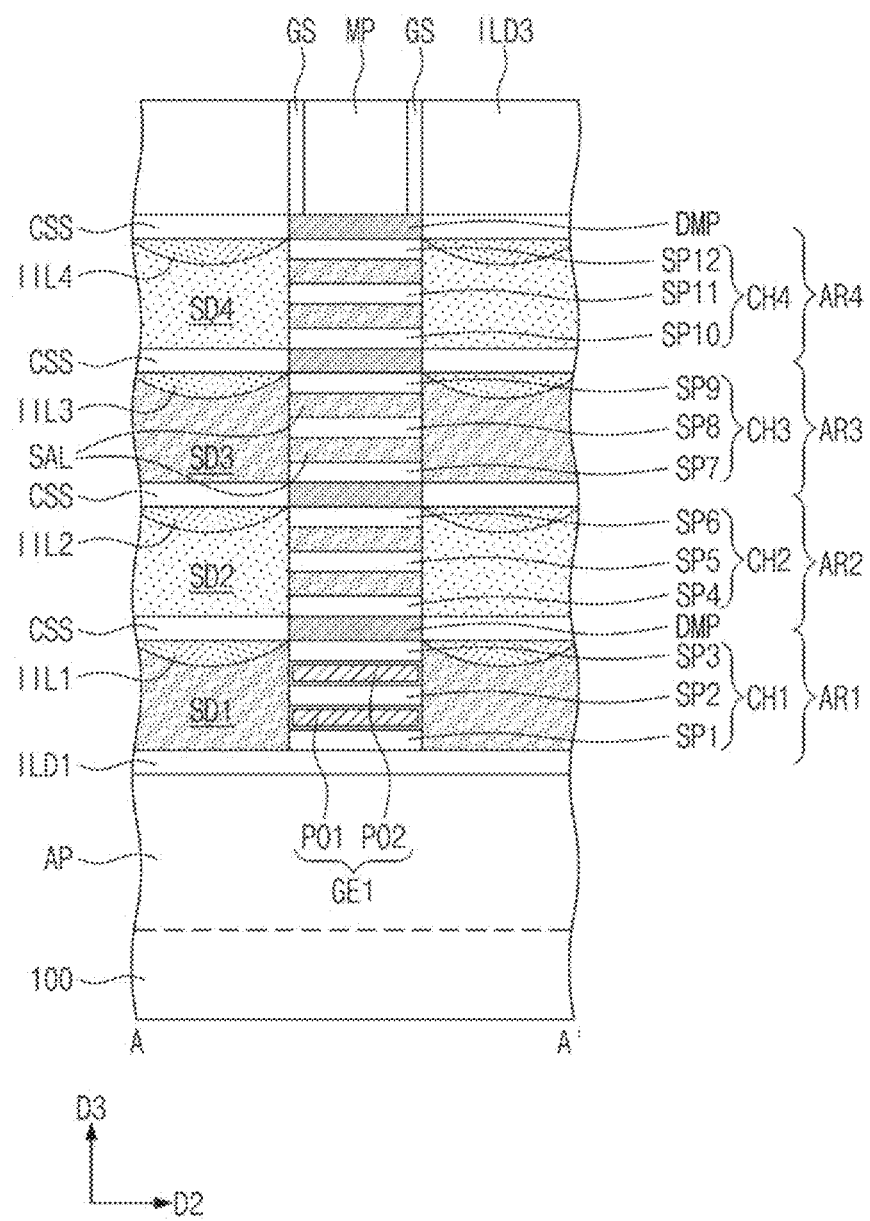
Figure 12B:
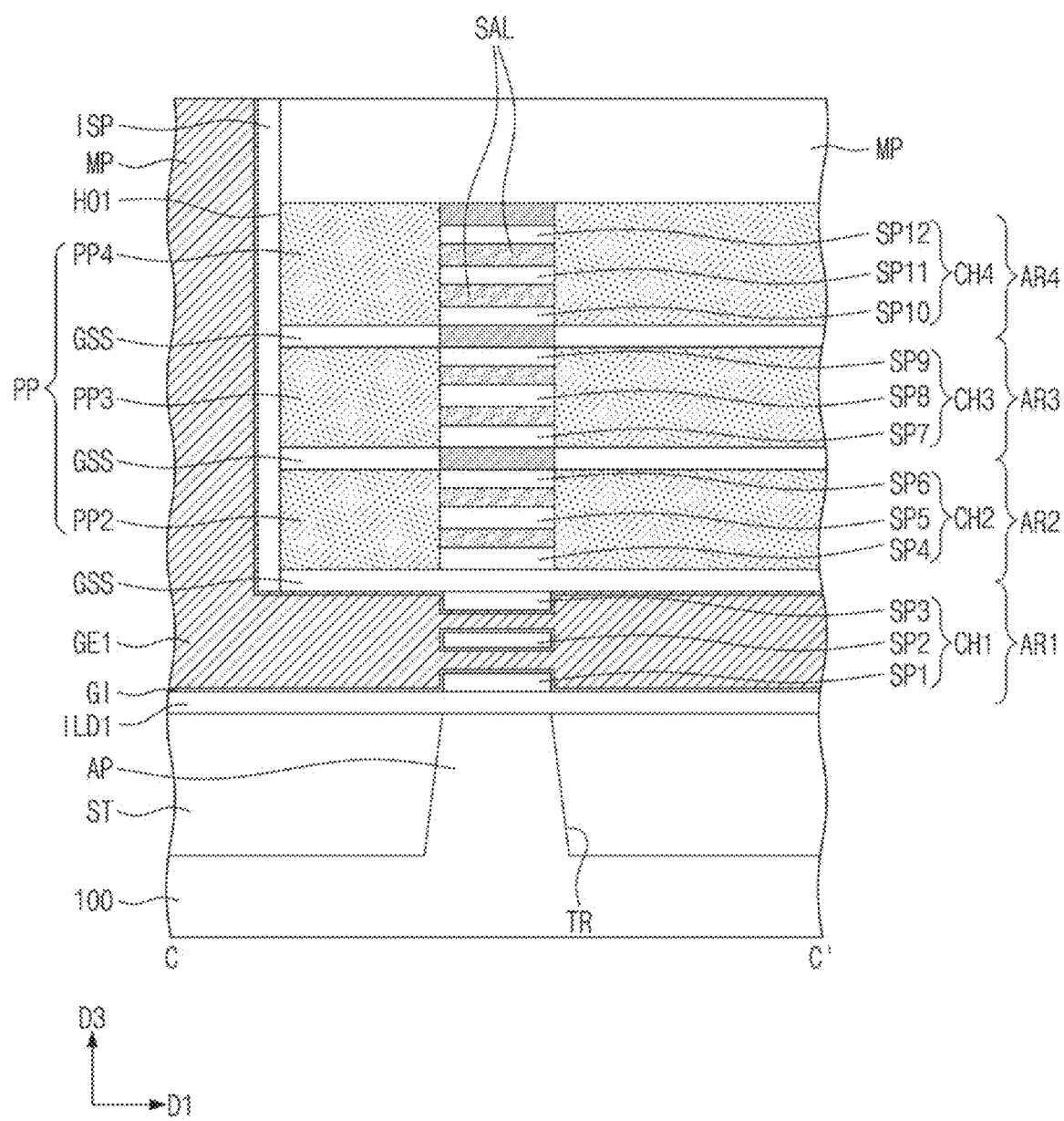

Referring to FIGS. 12A and 12B, a third insulating layer ILD3 may be formed on the uppermost first separation structure CSS. A top surface of the third insulating layer ILD3 may be coplanar with a top surface of the hard mask pattern MP.

The hard mask pattern MP, the fourth sacrificial pattern PP4, the third sacrificial pattern PP3, and the second sacrificial pattern PP2 may be sequentially etched to form a first hole HO1 exposing the first sacrificial pattern PP1. An inner spacer ISP may be formed on an inner wall of the first hole HO1 to be connected to the second separation structure GSS.

The first sacrificial pattern PP1 exposed through the first hole HO1 may be selectively removed. The second to fourth sacrificial patterns PP2 to PP4 may not be removed by the inner spacer ISP and the second separation structure GSS. After the first sacrificial pattern PP1 is removed, the sacrificial layers SAL remaining in the first active region AR1 may be selectively removed.

A gate insulating layer GI and a first gate electrode GE1 may be sequentially formed in the region where the first sacrificial pattern PP1 and the sacrificial layers SAL are removed, through the first hole HO1. The gate insulating layer GI may be formed to directly cover the first to third semiconductor patterns SP1, SP2, and SP3 of the first channel pattern CH1. The first gate electrode GE1 may be formed to surround the first to third semiconductor patterns SP1, SP2, and SP3. For example, the first gate electrode GE1 may include a first portion PO1 interposed between the first and second semiconductor patterns SP1 and SP2 and a second portion PO2 interposed between the second and third semiconductor patterns SP2 and SP3. The gate insulating layer GI and the first gate electrode GE1 may be formed with a process such as a chemical vapor deposition (CVD) process.

Figure 13A:
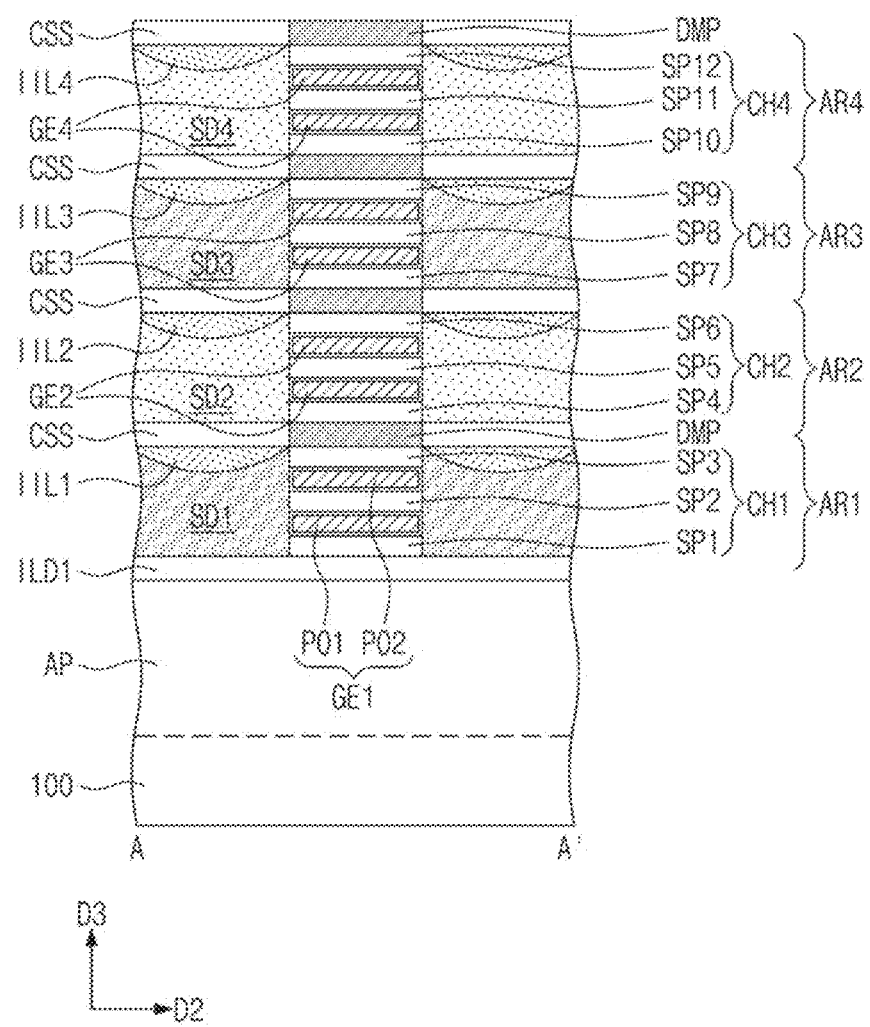
Figure 13B:
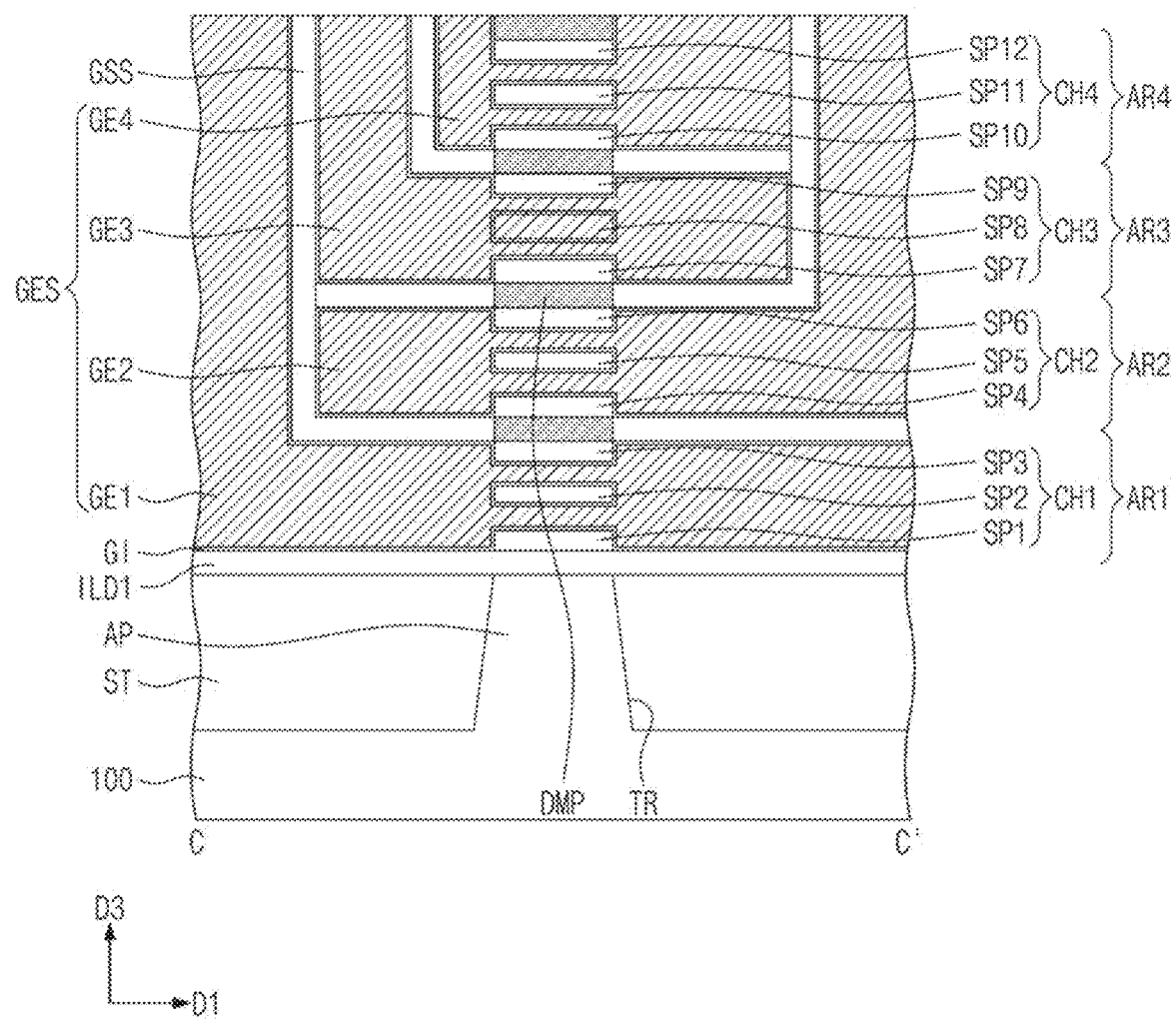

Referring to FIGS. 13A and 13B, a second gate electrode GE2 may be formed in a region from which the second sacrificial pattern PP2 and the sacrificial layers SAL are removed. A third gate electrode GE3 may be formed in a region from which the third sacrificial pattern PP3 and the sacrificial layers SAL are removed. A fourth gate electrode GE4 may be formed in a region from which the fourth sacrificial pattern PP4 and the sacrificial layers SAL are removed. The forming of the second to fourth gate electrodes GE2 to GE4 may be substantially the same as the above-described method of the forming of the first gate electrode GE1.

The first to fourth gate electrodes GE1 to GE4 may be sequentially stacked from the first tier to the fourth tier. The first to fourth gate electrodes GE1 to GE4 may constitute the gate structure GES. The gate structure GES may be planarized so that a top surface thereof is identical to a top surface of the uppermost dummy pattern DMP.

Figure 14A:
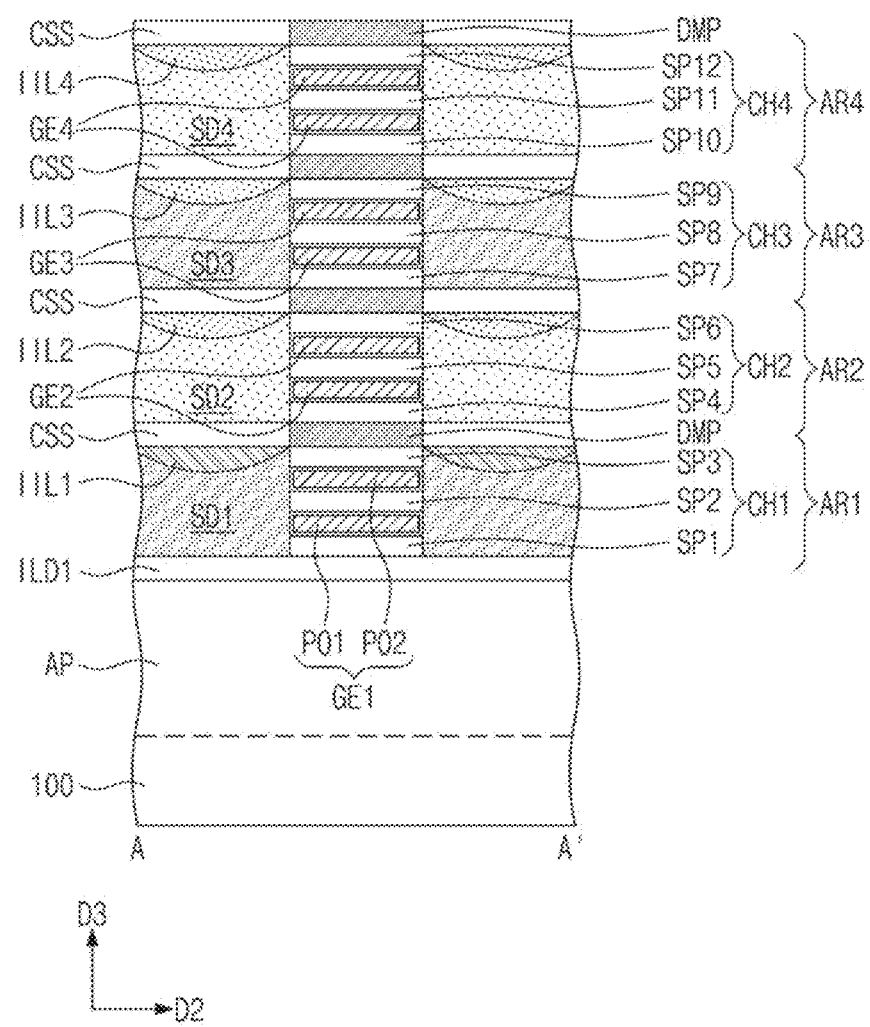
Figure 14B:
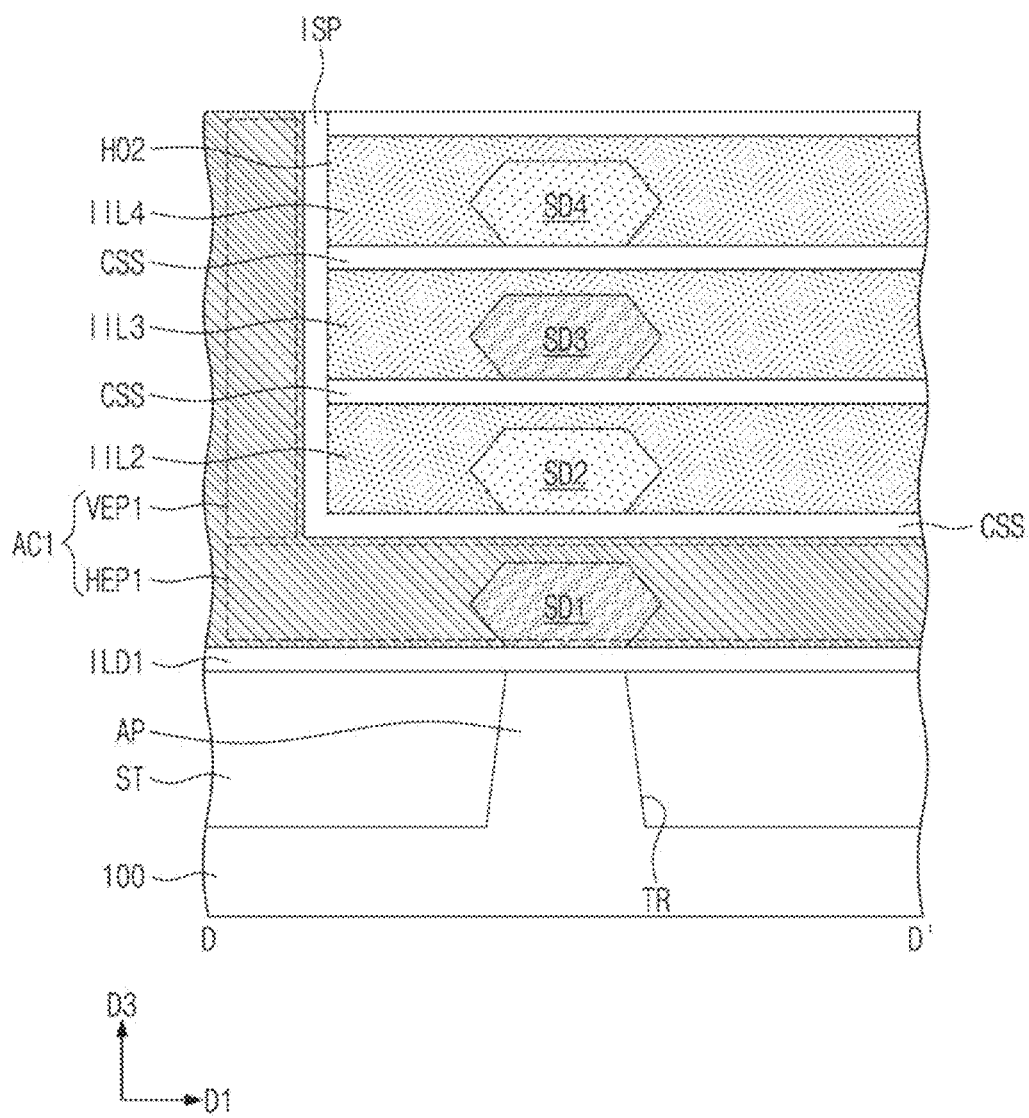

Referring to FIGS. 14A and 14B, the fourth dielectric layer IIL4, the third dielectric layer IIL3, and the second dielectric layer IIL2 may be sequentially etched to form a second hole HO2 exposing the first dielectric layer IIL1. An inner spacer ISP may be formed on an inner wall of the second hole HO2 to be connected to the first separation structure CSS.

The first dielectric layer IIL1 exposed through the second hole HO2 may be selectively removed. The second to fourth dielectric layers IIL2 to IIL4 may not be removed by the inner spacer ISP and the first separation structure CSS. As the first dielectric layer IIL1 is removed, the first source/drain pattern SD1 may be selectively exposed.

A conductive material in a region from which the first dielectric layer IIL1 is removed may be deposited through the second hole HO2 to form a first active contact AC1. The first active contact AC1 may be formed to directly cover the first source/drain pattern SD1. The first active contact AC1 may include a first horizontal extension part HEP1 filling a region from which the first dielectric layer IIL1 is removed and a first vertical extension part VEP1 filling the second hole HO2.

Figure 15A:
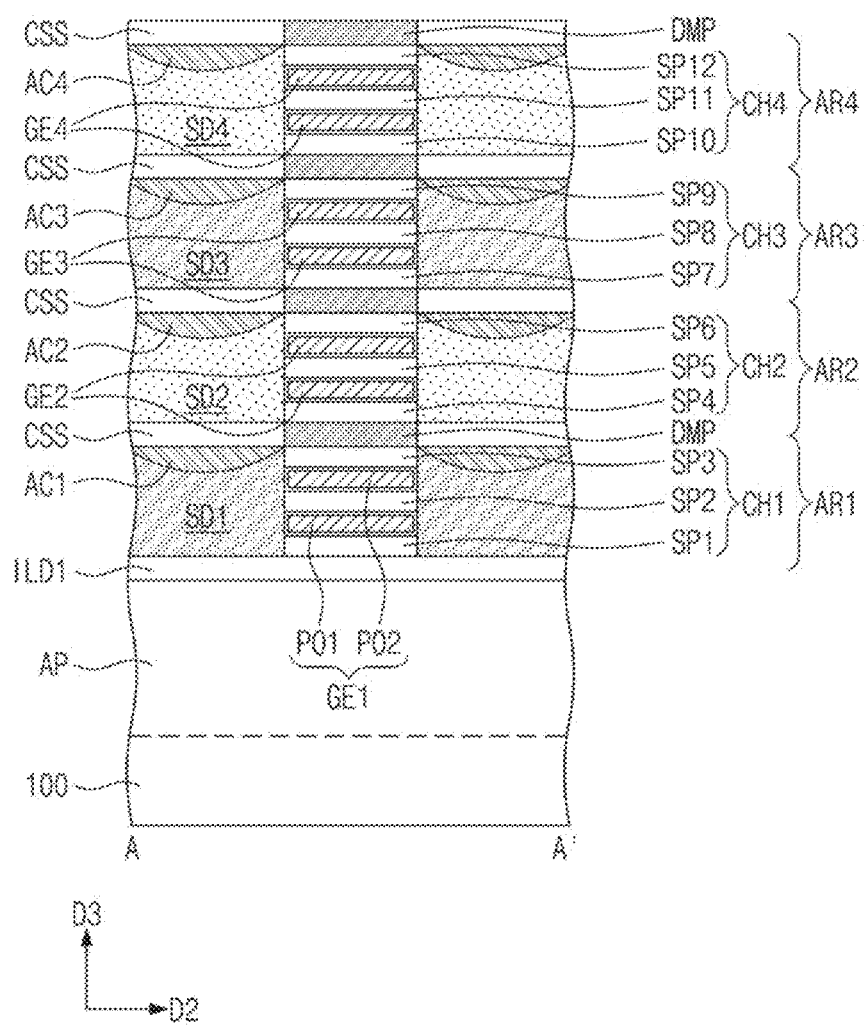
Figure 15B:
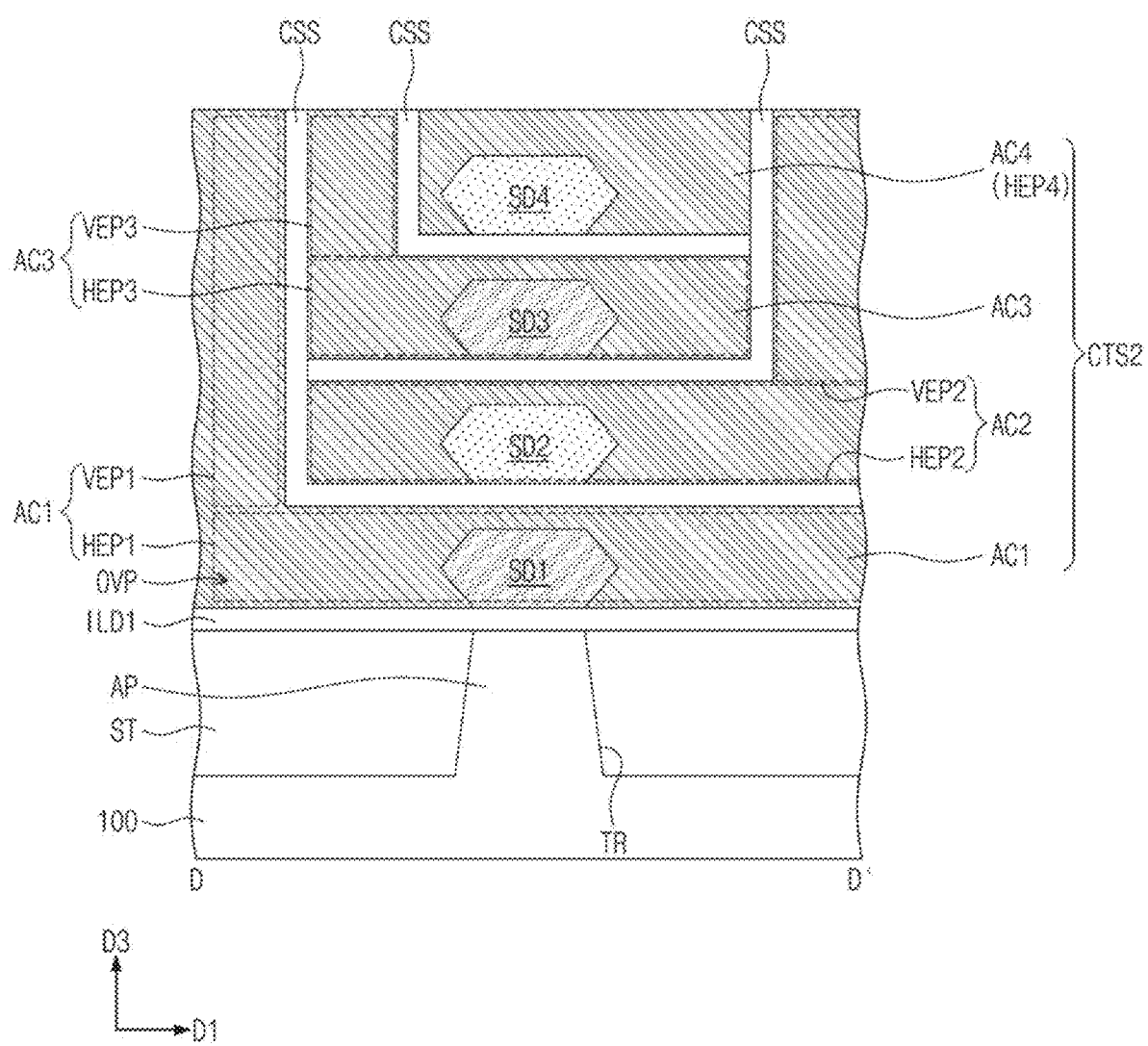

Referring to FIGS. 15A and 15B, a second active contact AC2 may be formed in a region from which the second dielectric layer IIL2 is removed. A third active contact AC3 may be formed in a region from which the third dielectric layer IIL3 is removed. A fourth active contact AC4 may be formed in a region from which the fourth dielectric layer IIL4 is removed. The forming of the second to fourth active contacts AC2 to AC4 may be substantially the same as the above-described method of the forming of the first active contact AC1.

The first to fourth active contacts AC1 to AC4 may be sequentially stacked from the first tier to the fourth tier. The first to fourth active contacts AC1 to AC4 may constitute a first contact structure CTS1 or a second contact structure CTS2. The first and second contact structures CTS1 and CTS2 may be respectively formed on both sides of the gate structure GES.

Referring back to FIGS. 5A to 5D, a second insulating layer ILD2 may be formed on the gate structure GES and the first and second contact structures CTS1 and CTS2. First to sixth contact lines CTL1 to CTL6 and vias ND may be formed in the second insulating layer ILD2. The vias ND may be formed on the gate structure GES and pad regions (i.e., nodes) of the first and second contact structures CTS1 and CTS2. The first to sixth contact lines CTL1 to CTL6 may be formed on the vias ND.

Figure 16:
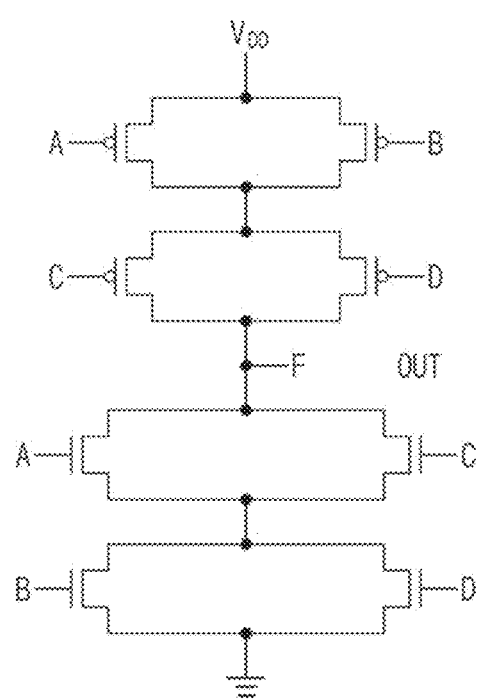
FIG. 16 is a circuit diagram of an AOI22 according to some example embodiments of inventive concepts.
Figure 17:
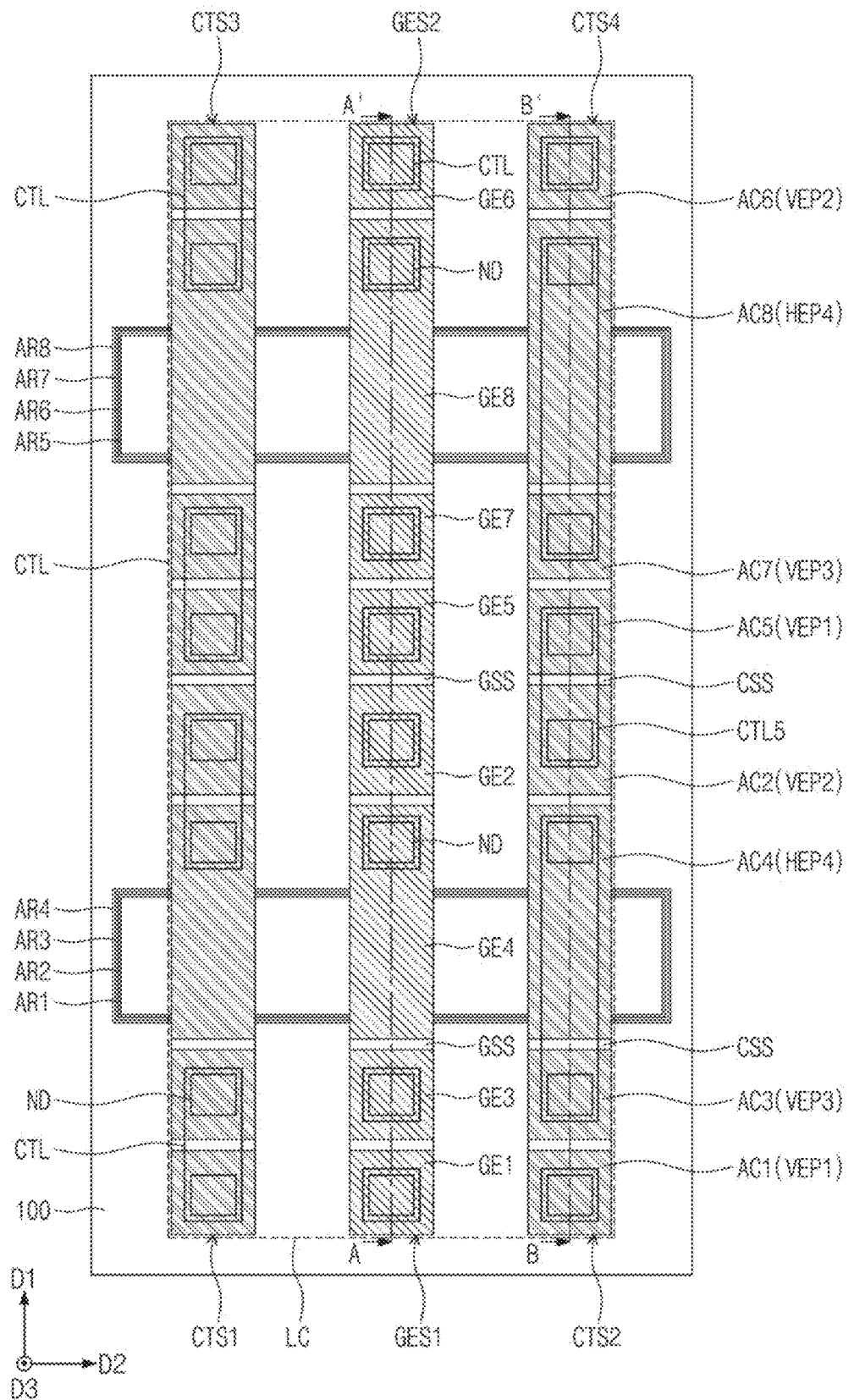
FIG. 17 is a plan view for explaining a three dimensional semiconductor device according to some example embodiments of inventive concepts.

FIG. 16 is a circuit diagram of an AOI22 according to some example embodiments of inventive concepts. FIG. 17 is a plan view for explaining a three dimensional semiconductor device according to some example embodiments of inventive concepts. FIGS. 18A and 18B are cross-sectional views taken along lines A-A' and B-B' of FIG. 17, respectively. A three dimensional semiconductor device shown in FIGS. 17, 18A and 18B is an example in which an AOI22 logic device of FIG. 16 is implemented as a three dimensional semiconductor device according to inventive concepts. In various example embodiments, detailed descriptions of technical features overlapping with those previously described with reference to FIGS. 4 and 5A to 5D will be omitted, and differences will be described in detail.

Referring to FIGS. 17, 18A, and 18B, a logic cell LC may include first to fourth active regions AR1 to AR4 stacked on a first active pattern AP1. The logic cell LC may include fifth to eighth active regions AR5 to AR8 on a second active pattern AP2. The second active pattern AP2 may be spaced apart from the first active pattern AP1 in a first direction D1.

A first gate structure GES1, a first contact structure CTS1, and a second contact structure CTS2 may be provided on the first to fourth active regions AR1 to AR4. The first gate structure GES1 may include first to fourth gate electrodes GE1 to GE4 sequentially stacked to correspond to first to fourth channel patterns CH1 to CH4. Each of the first and second contact structures CTS1 and CTS2 may include first to fourth active contacts AC1 to AC4 sequentially stacked to correspond to first to fourth source/drain patterns SD1 to SD4, respectively. In various example embodiments, the first and second active regions AR1 and AR2 may be PMOSFET regions. The third and fourth active regions AR3 and AR4 may be NMOSFET regions.

A second gate structure GES2, a third contact structure CTS3, and a fourth contact structure CTS4 may be provided on the fifth to eighth active regions AR5 to AR8. The second gate structure GES2 may include fifth to eighth gate electrodes GE5 to GE8 sequentially stacked to correspond to fifth to eighth channel patterns CH5 to CH8. Each of the third and fourth contact structures CTS3 and CTS4 may include fifth to eighth active contacts AC5 to AC8 sequentially stacked to correspond to fifth to eighth source/drain patterns SD5 to SD8. In various example embodiments, the fifth and sixth active regions AR5 and AR6 may be PMOSFET regions. The seventh and eighth active regions AR7 and AR8 may be NMOSFET regions including NMOS gates.

The first gate structure GES1 and the second gate structure GES2 may be arranged in the first direction D1. The second separation structure GSS may be interposed between the first gate structure GES1 and the second gate structure GES2. The first contact structure CTS1 and the third contact structure CTS3 may be arranged in the first direction D1. A first separation structure CSS may be interposed between the first contact structure CTS1 and the third contact structure CTS3. The second contact structure CTS2 and the fourth contact structure CTS4 may be arranged in the first direction D1. The first separation structure CSS may be interposed between the second contact structure CTS2 and the fourth contact structure CTS4.

Referring back to FIG. 17, in a plan view, a pad region (i.e., a node) of each of the first to eighth gate electrodes GE1 to GE8 may be exposed through a vertical extension part. Vias ND and contact lines CTL respectively connected to the first to eighth gate electrodes GE1 to GE8 may be provided. In a plan view, a pad region (i.e., a node) of each of the first to eighth active contacts AC1 to AC8 may be exposed through the vertical extension part. Vias ND and contact lines CTL respectively connected to the first to eighth active contacts AC1 to AC8 may be provided.

Although not shown, metal layers may be provided on the contact lines CTL. A voltage or a signal A, B, C, or D may be applied to the first to eighth gate electrodes GE1 to GE8 through the metal layers, respectively.

The three dimensional semiconductor device according to inventive concepts may provide the logic cell having the three dimensional structure with the reduced cell height by vertically stacking the first to fourth active regions. As a result, inventive concepts may improve the integration of the semiconductor device.

According to inventive concepts, by alternately stacking the stacked first to fourth active contacts in the L-shape and the inverted L-shape, the nodes may be two-dimensionally arranged on the first to fourth rows of the logic cell. Accordingly, the signals may be input/output to the first to fourth active regions.

When a layer or structure is described as having a first conductivity type, in general the layer may have a certain amount of activated impurities and/or dopants that may provide a majority carrier of a first type (e.g. one of electrons or holes), and a dopant concentration of the dopants of the first type may be greater than, e.g. much greater than, a dopant concentration of dopants of a second conductivity type. When a layer or structure is described as having a second conductivity type, in general the layer may have a certain amount of activated impurities and/or dopants that may provide a majority carrier of a second type (e.g. another one of electrons or holes), and a dopant concentration of the dopants of the second conductivity type may be greater than, e.g. much greater than, a dopant concentration of dopants of the first conductivity type.

While example embodiments of inventive concepts have been particularly shown and described, it will be understood by one of ordinary skill in the art that variations in form and detail may be made therein without departing from the spirit and scope of the attached claims. Example embodiments are not necessarily mutually exclusive with one another. For example, some example embodiments may include one or more features described with reference to one or more figures, and may also include one or more other features described with reference to one or more other figures.

What is claimed is:

1. A three dimensional semiconductor device comprising:
a first source/drain pattern, a second source/drain pattern, a third source/drain pattern, and a fourth source/drain pattern sequentially stacked on a substrate;
a contact structure on the first source/drain pattern, the second source/drain pattern, the third source/drain pattern, and the fourth source/drain pattern; and
a contact line on the contact structure,
wherein the contact structure includes a first active contact on the first source/drain pattern, a second active contact on the second source/drain pattern, a third active contact on the third source/drain pattern, and a fourth active contact on the fourth source/drain pattern,
wherein the first active contact includes a first horizontal extension part connected to the first source/drain pattern and a first vertical extension part extending from the first horizontal extension part to an uppermost portion of the contact structure,
wherein the second active contact includes a second horizontal extension part connected to the second source/drain pattern and a second vertical extension part extending from the second horizontal extension part to the uppermost portion of the contact structure,
wherein the third active contact includes a third horizontal extension part connected to the third source/drain pattern and a third vertical extension part extending from the third horizontal extension part to the uppermost portion of the contact structure,
wherein the fourth active contact includes a fourth horizontal extension part connected to the fourth source/drain pattern,
wherein the first vertical extension part is adjacent to a first side of the contact structure, and the second vertical extension part is adjacent to a second side of the contact structure,
wherein the third vertical extension part is arranged between the first vertical extension part and the second vertical extension part,
wherein the third vertical extension part is closer to the first vertical extension part than the second vertical extension part, and wherein the second horizontal extension part includes an overlapping portion vertically overlapping with at least part of the third vertical extension part.

2. The three dimensional semiconductor device of claim 1, further comprising:
a first channel pattern, a second channel pattern, a third channel pattern, and a fourth channel pattern sequentially stacked on the substrate and respectively connected to the first source/drain pattern, the second source/drain pattern, the third source/drain pattern, and the fourth source/drain pattern; and
a gate structure on the first channel pattern, the second channel pattern, the third channel pattern, and the fourth channel pattern,
wherein the gate structure includes
a first gate electrode on the first channel pattern,
a second gate electrode on the second channel pattern,
a third gate electrode on the third channel pattern, and
a fourth gate electrode on the fourth channel pattern.

3. The three dimensional semiconductor device of claim 2,
wherein the first channel pattern, the second channel pattern, the third channel pattern, and the fourth channel pattern include a plurality of semiconductor patterns that are stacked and spaced apart from one another, and
wherein each of the first gate electrode, the second gate electrode, the third gate electrode, and the fourth gate electrode surrounds the plurality of semiconductor patterns.

4. The three dimensional semiconductor device of claim 1, wherein the fourth active contact is interposed between the second vertical extension part and the third vertical extension part.

5. The three dimensional semiconductor device of claim 1, comprising a via between a top surface of the first vertical extension part, the second vertical extension part, and the third vertical extension part and the contact line.

6. The three dimensional semiconductor device of claim 1, wherein the first vertical extension part, the second vertical extension part, the third vertical extension part, and the fourth horizontal extension part are sequentially stacked along the first source/drain pattern, the second source/drain pattern, the third source/drain pattern, and the fourth source/drain pattern, respectively.

7. The three dimensional semiconductor device of claim 1, wherein the fourth active contact excludes a fourth vertical extension part.

8. The three dimensional semiconductor device of claim 1, wherein at least one of the first source/drain pattern, the second source/drain pattern, the third source/drain pattern, and the fourth source/drain pattern has an N-type conductivity type, and
wherein others of the first source/drain pattern, the second source/drain pattern, the third source/drain pattern, and the fourth source/drain pattern have a P-type conductivity type.

9. The three dimensional semiconductor device of claim 1,
wherein a first row, a second row, a third row, and a fourth row are sequentially defined in an extension direction of the contact structure,
wherein a top surface of the first vertical extension part is arranged in the first row,
wherein a top surface of the third vertical extension part is arranged in the second row,
wherein a top surface of the fourth horizontal extension part is arranged in the third row, and
wherein a top surface of the second vertical extension part is arranged in the fourth row.

10. A three dimensional semiconductor device comprising:
a first source/drain pattern, a second source/drain pattern, a third source/drain pattern, and a fourth source/drain pattern sequentially stacked on a substrate;
a contact structure on the first source/drain pattern, the second source/drain pattern, the third source/drain pattern, and the fourth source/drain pattern; and
a contact line on the contact structure,
wherein the contact structure includes
a first active contact connected to the first source/drain pattern,
a second active contact connected to the second source/drain pattern,
a third active contact connected to the third source/drain pattern, and
a fourth active contact connected to the fourth source/drain pattern,
wherein the first active contact, the second active contact, the third active contact, and the fourth active contact are sequentially stacked along the first source/drain pattern, the second source/drain pattern, the third source/drain pattern, and the fourth source/drain pattern, respectively,
wherein the first active contact, the second active contact, and the third active contact include a first vertical extension part, a second vertical extension part, and a third vertical extension part extending to an uppermost portion of the contact structure, respectively,
wherein the second vertical extension part is arranged opposite to the first vertical extension part with the stacked first source/drain pattern, second source/drain pattern, third source/drain pattern, and fourth source/drain pattern interposed therebetween,
wherein the third vertical extension part is arranged opposite to the second vertical extension part with the stacked first source/drain pattern, second source/drain pattern, third source/drain pattern, and fourth source/drain pattern interposed between the third vertical extension part and the second vertical extension part, and
wherein the second active contact includes an overlapping portion vertically overlapping with at least a part of the third active contact.

11. The three dimensional semiconductor device of claim 10, comprising:
a first channel pattern, a second channel pattern, a third channel pattern, and a fourth channel pattern sequentially stacked on the substrate and configured to be connected to the first source/drain pattern, the second source/drain pattern, the third source/drain pattern, and the fourth source/drain pattern, respectively; and
a gate structure on the first channel pattern, the second channel pattern, the third channel pattern, and the fourth channel pattern,
wherein the gate structure includes
a first gate electrode on the first channel pattern,
a second gate electrode on the second channel pattern,
a third gate electrode on the third channel pattern, and
a fourth gate electrode on the fourth channel pattern.

12. The three dimensional semiconductor device of claim 10, wherein the fourth active contact is interposed between the second vertical extension part and the third vertical extension part.

13. The three dimensional semiconductor device of claim 10, comprising a via between a top surface of the first vertical extension part, the second vertical extension part, and the third vertical extension part and the contact line.

14. The three dimensional semiconductor device of claim 10,
wherein at least one of the first source/drain pattern, the second source/drain pattern, the third source/drain pattern, and the fourth source/drain pattern has an N-type conductivity type, and
wherein others of the first source/drain pattern, the second source/drain pattern, the third source/drain pattern, and the fourth source/drain pattern have a P-type conductivity type.

15. A three dimensional semiconductor device comprising:
a first source/drain pattern, a second source/drain pattern, a third source/drain pattern, and a fourth source/drain pattern sequentially stacked on a substrate;
a contact structure on the first source/drain pattern, the second source/drain pattern, the third source/drain pattern, and the fourth source/drain pattern; and
a first contact line and a second contact line on the contact structure,
wherein the contact structure includes
a first active contact connected to the first source/drain pattern,
a second active contact connected to the second source/drain pattern,
a third active contact connected to the third source/drain pattern, and
fourth active contact connected to the fourth source/drain pattern,
wherein the first active contact, the second active contact, the third active contact, and the fourth active contact are sequentially stacked along the first source/drain pattern, the second source/drain pattern, the third source/drain pattern, and the fourth source/drain pattern, respectively,
wherein the first active contact, the second active contact, and the third active contact include a first vertical extension part, a second vertical extension part, and a third vertical extension part extending to an uppermost portion of the contact structure, respectively,
wherein the first vertical extension part and the third vertical extension part adjacent to each other are electrically connected to each other by the first contact line, and
wherein the second vertical extension part and the fourth active contact adjacent to each other are electrically connected to each other by the second contact line.

16. The three dimensional semiconductor device of claim 15,
wherein the first vertical extension part is adjacent to one side of the contact structure,
wherein the second vertical extension part is adjacent to another side of the contact structure, and
wherein the third vertical extension part is between the first vertical extension part and the second vertical extension part, and is closer to the first vertical extension part than to the second vertical extension part.

17. The three dimensional semiconductor device of claim 15, wherein the fourth active contact is interposed between the second vertical extension part and the third vertical extension part.

18. The three dimensional semiconductor device of claim 15, comprising:
a first channel pattern, a second channel pattern, a third channel pattern, and a fourth channel pattern sequentially stacked on the substrate, and connected to the first source/drain pattern, the second source/drain pattern, the third source/drain pattern, and the fourth source/drain pattern, respectively; and
a gate structure on the first source/drain pattern, the second source/drain pattern, the third source/drain pattern, and the fourth source/drain pattern,
wherein the gate structure includes
a first gate electrode on the first channel pattern,
a second gate electrode on the second channel pattern,
a third gate electrode on the third channel pattern, and
a fourth gate electrode on the fourth channel pattern.

19. The three dimensional semiconductor device of claim 18, wherein the first gate electrode, the second gate electrode, the third gate electrode, and the fourth gate electrode are separated from one another by a separation structure.

* * * * *